(12) United States Patent
Yamashita et al.

(10) Patent No.: US 7,884,785 B2
(45) Date of Patent: Feb. 8, 2011

(54) ACTIVE MATRIX DISPLAY APPARATUS AND ELECTRONIC APPARATUS

(75) Inventors: Junichi Yamashita, Tokyo (JP);
Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 820 days.

(21) Appl. No.: 11/852,598

(22) Filed: Sep. 10, 2007

(65) Prior Publication Data

US 2008/0062096 A1    Mar. 13, 2008

(30) Foreign Application Priority Data

Sep. 11, 2006   (JP) .......................... P2006-244984

(51) Int. Cl.
*G09G 3/32* (2006.01)
(52) U.S. Cl. .............................. 345/82; 345/76; 345/81
(58) Field of Classification Search ............ 345/76–85, 345/90–96
See application file for complete search history.

(56) References Cited

U.S. PATENT DOCUMENTS

2007/0207274 A1* 9/2007 Fujii .......................... 427/532
2009/0302757 A1* 12/2009 Arai ........................... 313/505
2010/0026729 A1* 2/2010 Toyomura et al. ........... 345/690

FOREIGN PATENT DOCUMENTS

JP        2004-302319        10/2004

OTHER PUBLICATIONS

Japanese Office Action dated Aug. 5, 2008 for Application No. 2006-244984.

* cited by examiner

*Primary Examiner*—Vijay Shankar
(74) *Attorney, Agent, or Firm*—SNR Denton US LLP

(57) ABSTRACT

An active matrix display apparatus includes a substrate having scanning lines, signal lines, and pixels thereon. Each of the pixels includes a sampling transistor for taking in a video signal, a drive transistor for generating a driving current, and a light-emitting device which emits light with luminance in accordance with the video signal. The two-terminal thin-film light-emitting device includes an anode and cathode electrodes, and a light-emitting layer arranged therebetween. At least one of the electrodes is divided into pieces whereby the light-emitting device is divided into sub-light-emitting devices. The sub-light-emitting devices receive the driving current from a driving transistor and emit light with luminance in accordance with the video signal. A sub-light-emitting devices including a short-circuit defect is separated from the corresponding one of the pixels and the driving current is supplied to the remaining sub-light-emitting devices, whereby the luminance in accordance with the video signal is maintained.

3 Claims, 13 Drawing Sheets

FIG. 16
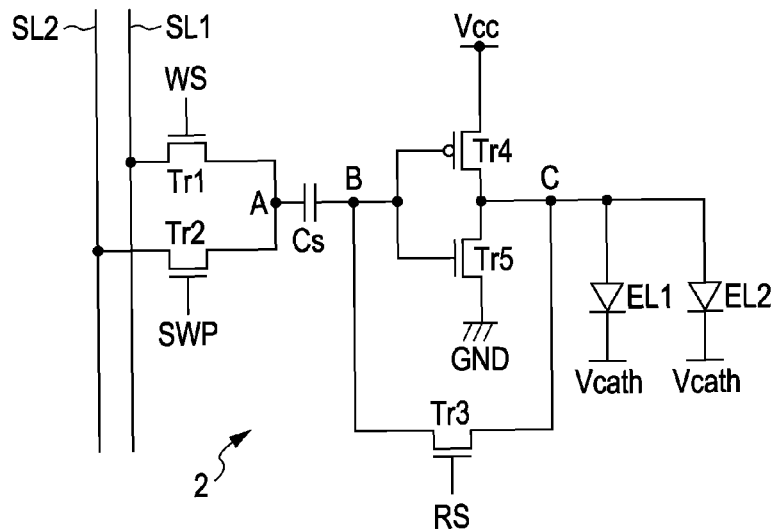
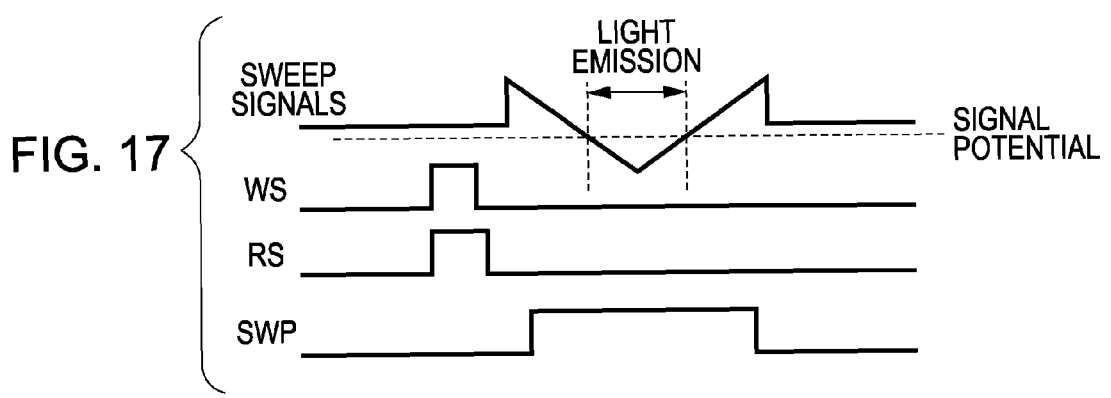
FIG. 17

ACTIVE MATRIX DISPLAY APPARATUS AND ELECTRONIC APPARATUS

CROSS REFERENCES TO RELATED APPLICATIONS

The present invention contains subject matter related to Japanese Patent Application JP 2006-244984 filed in the Japanese Patent Office on Sep. 11, 2006, the entire contents of which are incorporated herein by reference.

BACKGROUND OF THE INVENTION

1. Field of the Invention

The present invention relates to active matrix display apparatuses having light-emitting devices such as organic EL devices as pixels, and relates to electronic apparatuses which incorporate such display apparatuses. The present invention specifically relates to a technique of correcting pixels having defects.

2. Description of the Related Art

In recent years, organic electro-luminescence (EL) display apparatuses have been receiving attention as flat-screen display apparatuses. Since such an organic EL display apparatus uses self-luminous devices as pixels, a wide view angle is achieved and furthermore the need for a backlight may be eliminated resulting in achievement of a thin display apparatus. Moreover, use of such an organic EL display apparatus reduces power consumption and leads to a prompt response.

Such an organic EL display apparatus includes a substrate and organic EL devices arranged thereon in a matrix. Each of the organic EL devices includes an anode electrode and a cathode electrode and an organic light-emitting layer which is sandwiched between the anode electrode and the cathode electrodes and which has a light-emitting function.

When the organic EL devices are produced, if fine contaminant particles in the atmosphere adhere between the anodes and the cathodes, short-circuit defects are generated. In such a case, the organic EL devices do not emit light resulting in recognition of so-called dark spot defects. Techniques of correcting such dark spot defects have been developed and are disclosed, for example, in Japanese Unexamined Patent Application Publication Nos. 2003-178871, 2003-233329, and 2003-280593.

Japanese Unexamined Patent Application Publication No. 2003-178871 discloses a technique of finding a defect portion in a pixel having a dark spot using an optical microscope when the defect portion is generated due to a short circuit. When a short-circuit defect portion is found, a laser beam is emitted so that an organic EL layer at the short-circuit defect portion is insulated. When the short-circuit defect portion is insulated, the pixel emits light normally, that is, the pixel is corrected.

Japanese Unexamined Patent Application Publication No. 2003-233329 discloses a technique of emitting a laser beam onto a short-circuit defect portion corresponding to a dark spot in an organic EL device so as to remove electrodes arranged in a region including the short-circuit defect portion in a pixel. Accordingly, a portion of the organic EL device in which the electrode is removed does not emit light. However, since a current flows through a remaining portion of the organic EL device, the pixel emits light. Thus, the pixel is substantially normalized.

Japanese Unexamined Patent Application Publication No. 2003-280593 discloses an active-driving display apparatus using pixels including a plurality of subpixels. The display apparatus includes at least one pixel unit having pixels formed from light modulation devices and having active devices used for drive-controlling the pixels so as to drive the active-drive display apparatus including first subpixels and second subpixels. The display apparatus includes a first subpixel controller for drive-controlling the first subpixels so as to display multiple tones including halftones and a second subpixel controller for drive-controlling the second subpixels so as to perform binary display of light display or dark display.

SUMMARY OF THE INVENTION

In the techniques of recovering pixels disclosed in Japanese Unexamined Patent Application Publication Nos. 2003-178871 and 2003-233329, a laser beam is emitted onto a small area, that is, a portion including a short circuit defect of an organic EL device so that a defect pixel is corrected. Specifically, in Japanese Unexamined Patent Application Publication No. 2003-178871, an organic EL layer in a defect portion is insulated by emitting a laser beam thereto. In Japanese Unexamined Patent Application Publication No. 2003-233329, electrodes in a defect portion are removed. In both cases, a laser beam is emitted onto a small area, that is, a short-circuit defect portion, and this makes correction processing difficult. Furthermore, since such a defect portion is usually small portion, a large amount of effort is necessary to find the detect portion using a microscope. Moreover, since a laser beam is emitted onto a small area, the correction processing becomes complicated.

In Japanese Unexamined Patent Application Publication No. 2003-280593, a technique as for dealing with dark spot defects is disclosed in which a plurality of drive transistors are provided as subpixels in a pixel and the subpixels are arranged so as to be overlapped and integrated in the pixel. In this technique, however, the number of drive transistors and switching transistors is increased in proportion to the number of subpixels. In addition, the number of signal lines and the amount of pixel capacity are also increased. The increased number of pixel circuit elements is a significant factor of difficulty in production of a high-resolution panel. Accordingly, the technique of the related art has a disadvantage that makes production of a high-resolution panel difficult and does not meet the recent strong demand for a high-resolution panel.

It is desirable to provide an active matrix display apparatus capable of correcting a dark spot defect, which is generated due to a short-circuit defect of a light-emitting device, by a simple operation without a complicated configuration of pixel circuits. According to an embodiment of the present invention, there is provided an active matrix display apparatus having scanning lines as rows for supplying control signals, signal lines as columns for supplying video signals, pixels arranged in matrix so as to correspond to intersections of the scanning lines and the signal lines, and a substrate on which the scanning lines, the signal lines, and the pixels are arranged, each of the pixels including a sampling transistor used to take in one of the video signals in response to one of the control signals, a drive transistor used to generate a driving current in accordance with the taken video signal, and a light-emitting device which emits light with luminance in accordance with the video signal when the driving current is supplied. The light-emitting device includes a pair of electrodes, that is, an anode and a cathode, and a light-emitting layer arranged between the pair of electrodes, and therefore is a two-terminal thin-film device. At least one of the pair of electrodes is divided into a plurality of pieces whereby the light-emitting device is divided into a plurality of sub-lightemitting devices. The plurality of sub-light-emitting devices receive the driving current from the drive transistor and emit light with luminance as a whole in accordance with the video signal. When one of the sub-light-emitting devices includes a short-circuit defect, the sub-light-emitting device including the short-circuit defect is separated from the corresponding one of the pixels and the driving current is supplied to the remaining sub-light-emitting devices, and the luminance in accordance with the video signal is maintained using the remaining sub-light-emitting devices.

Preferably, each of the plurality of electrodes obtained by dividing one of the pair of electrodes is connected to a corresponding path of a current supplied from the single drive transistor through a corresponding line, and when the line is broken by a laser beam emitted from the outside of the substrate, the sub-light-emitting device including the short-circuit defect is separated from the current path.

Accordingly, a light-emitting device included in one of a plurality of pixels is divided in advance into a plurality of sub-light-emitting devices such as a pair of sub-light-emitting devices. When a short-circuit defect is generated in one of the pair of sub-light-emitting devices, the sub-light-emitting device including the short-circuit defect is separated from a corresponding one of a plurality of pixel circuits. By this, the dark spot defect is corrected with ease. Probability of generation of a short-circuit defect due to adhesion of a contaminant particle in both of the pair of sub-light-emitting devices is extremely low. Normally, a short-circuit defect is generated only one of the pair of the sub-light-emitting devices. However, when the short-circuit defect is generated, since a current is concentrated on a short-circuit portion, both of the pair of the sub-light-emitting devices do not emit light resulting in generation of a dark spot defect in the pixel. Accordingly, in the embodiments of the present invention, since the sub-light-emitting device including the short-circuit defect is separated from the corresponding one of the pixel circuits, a driving current is supplied to the remaining sub-light-emitting device and the dark spot defect is corrected. In this correction processing, emission of a laser beam onto a small area, that is, a short-circuit defect portion, may be eliminated, but merely one of the sub-light-emitting devices is separated from the corresponding one of the pixel circuit. Accordingly, the correction processing is simplified. Especially, in the present invention, a redundant structure in which two pixel circuits are arranged in each of a plurality of pixels is not employed, but a configuration of each of a plurality of pixels including a single sampling transistor, a single drive transistor, and a plurality of sub-light-emitting devices is employed. Consequently, the configuration of the pixel is not complicated.

BRIEF DESCRIPTION OF THE DRAWINGS

FIG. 16 is a circuit diagram illustrating a display apparatus according to a yet further embodiment of the present invention;

FIG. 17 is a timing chart used for explaining an operation of the display apparatus shown in FIG. 16;

DESCRIPTION OF THE PREFERRED EMBODIMENTS

Figure 1:
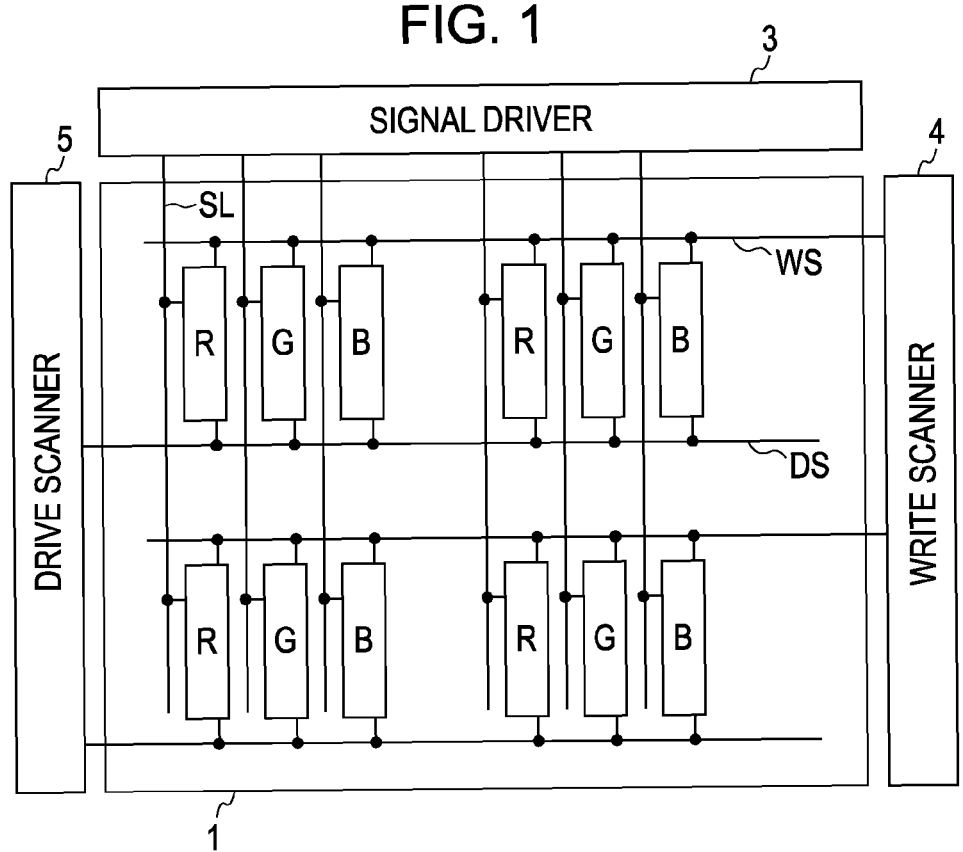
FIG. 1 is a block diagram illustrating a fundamental configuration of a display apparatus according to an embodiment of the present invention.

Embodiments of the present invention will be described hereinafter with reference to the accompanying drawings. FIG. 1 is a block diagram illustrating an entire configuration of an active matrix display apparatus. As shown in FIG. 1, the active matrix display apparatus includes a pixel array portion 1, which is a main portion of the apparatus, and peripheral circuits. The peripheral circuits include a signal driver 3, a write scanner 4, and a drive scanner 5. The pixel array portion 1 includes pixels R, G, and B arranged in a matrix so as to correspond to intersections of scanning lines WS as rows and signal lines SL as columns. Although the pixels R, G, and B are provided for performing color display, the present invention is not limited to this. The signal lines SL are driven by the signal driver 3. The signal driver 3 supplies video signals to the signal lines SL. The scanning lines WS are scanned by the write scanner 4. Note that other scanning lines DS are also arranged in parallel to the scanning lines WS. The scanning lines DS are scanned by the drive scanner 5. The write scanner 4 and the drive scanner 5 constitute a scanner portion and sequentially drive pixel rows every horizontal period. When pixels are selected using scanning lines WS, video signals supplied from signal lines SL are sampled. When the pixels are further selected using scanning lines DS, light-emitting devices included in the pixels are driven in response to the sampled video signals.

The pixel array portion 1 is generally arranged on an insulating substrate such as a glass substrate and formed as a flat panel. Each of the pixels includes a light-emitting device and a pixel circuit used for driving the light-emitting device. Each of the pixel circuits includes an amorphous silicon thin-film transistor (TFT) or a low-temperature polysilicon TFT. When an amorphous silicon TFT is used, the scanner portion is constituted by a TAB (tape automated bonding) separately from the flat panel, and is connected to the flat panel using a flexible cable. On the other hand, when a low-temperature polysilicon TFT is used, since the scanner portion may be constituted by the same low-temperature polysilicon TFT as the pixel unit, the pixel array portion 1 and the scanner portion are integrally formed on the flat panel.

Figure 2:
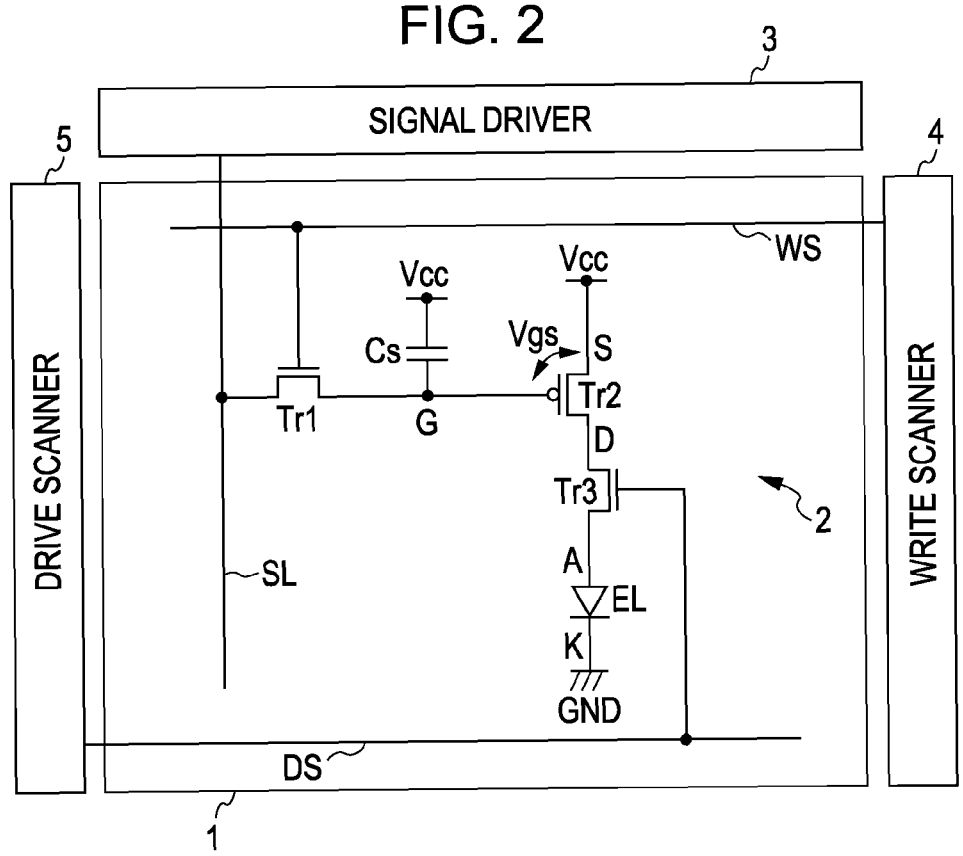
FIG. 2 is a circuit diagram schematically showing a reference example of a pixel circuit of the display apparatus shown in FIG. 1.

FIG. 2 is a circuit diagram schematically showing a reference example of pixel configuration of the display apparatus shown in FIG. 1. As shown in FIG. 2, each of the pixels includes a pixel circuit 2 and a light-emitting device EL. The pixel circuit 2 includes an N-channel sampling transistor Tr1, a P-channel drive transistor Tr2, an N-channel switching transistor Tr3, and a hold capacitor Cs. The N-channel sampling transistor Tr1 to the N-channel switching transistor Tr3 are thin-film transistors (TFTs), and the hold capacitor Cs is a thin-film capacitor element. The light-emitting device EL includes a pair of electrodes, that is, an anode A and a cathode K, and a light-emitting layer sandwiched therebetween, and therefore is a two-terminal thin film device.

A source S of the P-channel drive transistor Tr2 is connected to a power source potential Vcc. A drain D of the P-channel drive transistor Tr2 is connected to the anode A of the light-emitting device EL through the N-channel switching transistor Tr3. A gate of the N-channel switching transistor Tr3 is connected to the drive scanner 5 through a corresponding one of the scanning lines DS. The cathode K of the light-emitting device EL is connected to the ground potential GND. A gate G of the P-channel drive transistor Tr2 is connected to a corresponding one of signal lines SL through the N-channel sampling transistor Tr1. A gate of the N-channel sampling transistor Tr1 is connected to the write scanner 4 through a corresponding one of the scanning lines WS. The hold capacitor Cs is connected between the gate G of the P-channel drive transistor Tr2 and the power source potential Vcc.

An operation of the pixel circuit 2 will be described taking one pixel circuit as an example. First, one of the scanning lines WS is brought into a selected state (hereinafter referred to as a "high level state"). When a video signal is supplied from the signal driver 3 to a corresponding one of the signal lines SL, the N-channel sampling transistor Tr1 is brought into a conduction state and the video signal is written to the hold capacitor Cs. A signal potential of the video signal written to the hold capacitor Cs is a gate potential of the P-channel drive transistor Tr2. Then the one of the scanning lines WS is brought into a non-selected state (hereinafter referred to as a "low level state"), and the corresponding one of the signal lines SL and the P-channel drive transistor Tr2 are electrically disconnected from each other. However, a gate potential Vgs of the P-channel drive transistor Tr2 is stably held by the hold capacitor Cs. Then, one of the scanning lines DS is brought into a selected state (hereinafter referred to as a "high level state"), the N-channel switching transistor Tr3 is brought into a conduction state and a driving current flows from the power source potential Vcc to the ground potential GND through the P-channel drive transistor Tr2, the N-channel switching transistor Tr3, and the light-emitting device EL. When the one of the scanning lines DS is brought into a non-selected state, the N-channel switching transistor Tr3 is turned off and the driving current stops flowing. The N-channel switching transistor Tr3 is used for controlling light emission time of the light-emitting device EL.

The driving current flowing through the P-channel drive transistor Tr2 and the light-emitting device EL has a value corresponding to the voltage Vgs between the gate G and the source S of the P-channel drive transistor Tr2. The light-emitting device EL emits light with luminance in accordance with the current value. An operation, as described above, of selecting one of the scanning lines WS and supplying a video signal supplied to a corresponding one of the signal lines SL to inside of the pixel circuit 2 is called "writing." As described above, once the video signal is written, the light-emitting device EL keeps emitting light with a certain luminance until the next video signal is written.

Figure 3:
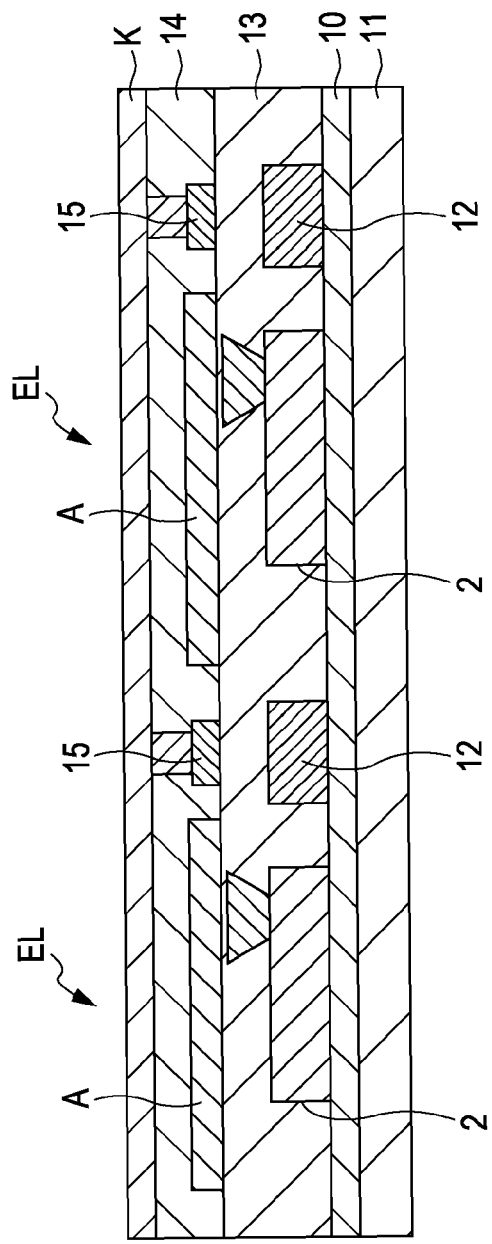
FIG. 3 is a sectional view schematically showing a configuration of the reference example of the pixel circuit shown in FIG. 2.

FIG. 3 is a sectional view schematically showing a layer configuration of the pixel shown in FIG. 2 in detail. Two pixels are shown for simplicity. As shown in FIG. 3, the pixels are formed on a substrate 10 such as a glass substrate. A back surface of the substrate 10 is covered with a light-shielding film 11 such as a metal film. As described above, each of the pixels generally includes a light-emitting device EL and a pixel circuit 2 which is used for driving the light-emitting device EL. Each of the pixel circuits 2 including thin-film devices such as a thin-film transistor and a thin-film capacitor is arranged on the substrate 10. Power source lines (Vcc) 12 are also arranged on the substrate 10. The pixel circuits 2 and the power source lines 12 are covered with a planarization film 13. The light-emitting devices EL are formed on the planarization film 13. Each of the light-emitting devices EL includes an anode A, a cathode K, and an organic light-emitting layer 14 interposed therebetween. One of the anodes A is provided for each of pixels and is connected to a corresponding one of the pixel circuits 2 through a corresponding one of contact holes formed in the planarization film 13. In addition to the anodes A, auxiliary lines (GND) 15 are also arranged on the planarization film 13. The anodes A and the auxiliary lines 15 are covered with the organic light-emitting layer 14. The cathode K is formed on the organic light-emitting layer 14. The cathode K is commonly formed for the pixels and is connected to the auxiliary lines (GND) 15 through contact holes formed in the organic light-emitting layer 14. The cathode K is formed of a transparent electrode material such as ITO.

Figure 4:
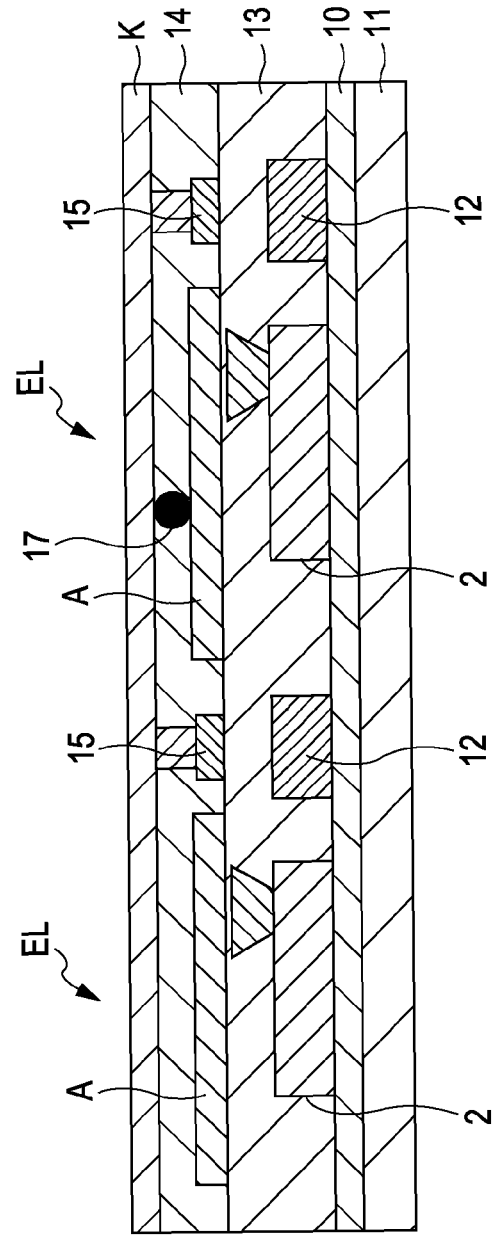
FIG. 4 is a sectional view illustrating the reference example of the pixel circuit shown in FIG. 2.

FIG. 4 is a schematic view showing a short-circuit defect of a pixel. Reference numerals the same as those shown in FIG. 3 are used in FIG. 4 to denote the same components for simplicity. In two pixels shown in FIG. 4, a pixel on the left side is a normal pixel, but a pixel on the right side has a short-circuit defect and therefore has a dark spot defect. Specifically, a conductive contaminant particle 17 adhering between a cathode K and an anode A causes the short-circuit defect. In the normal pixel on the left side, a driving current is supplied from a power source line (Vcc) 12 through a pixel circuit 2 to the anode A. The driving current is further supplied through an organic light-emitting layer 14 to the cathode K, and is further supplied to an auxiliary line (GND) 15 to be grounded. Thus, a light-emitting device EL performs normal light emission with luminance in accordance with the driving current. On the other hand, in the pixel on the right side which has a short-circuit defect, a driving current supplied from a pixel circuit 2 to an anode A is not supplied to the organic light-emitting layer 14 but is concentrated on the conductive contaminant particle 17 and thereafter is supplied to the cathode K and an auxiliary lines 15 to be grounded. Accordingly, although the driving current is supplied, the organic light-emitting layer 14 hardly emits light leading to a dark spot defect. Since generation of a dark spot defect causes deterioration of an image quality, the defect should be corrected. Correction of the defect leads to improvement of a production yield of a panel.

Figure 5:
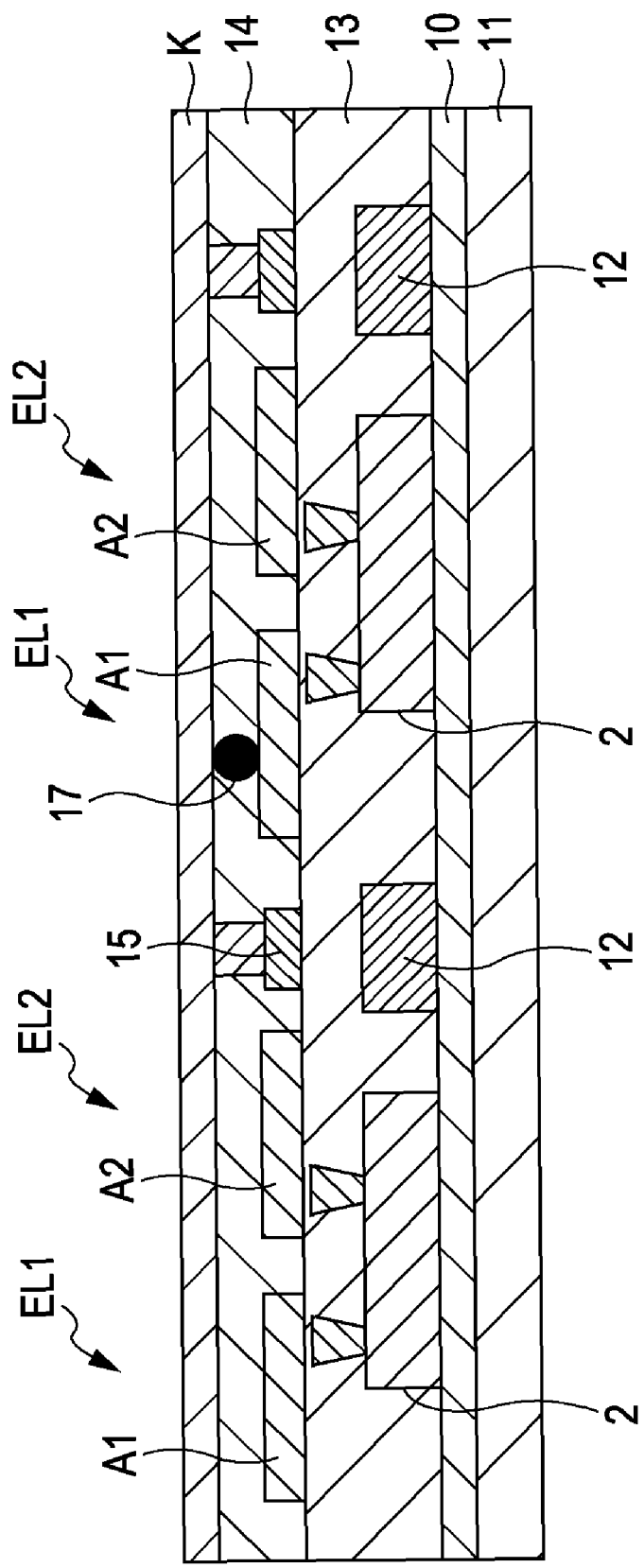
FIG. 5 is a sectional view schematically illustrating an operation of the display apparatus according to the embodiment of the present invention.

FIG. 5 is a partial sectional view schematically showing the active matrix display apparatus according to the present invention. Reference numerals the same as those shown in FIGS. 3 and 4 are used in FIG. 5 to denote the same components for simplicity. The active matrix display apparatus according to the present invention includes scanning lines as rows that basically supply control signals, signal lines as columns that supply video signals, pixels arranged so as to correspond to intersections of the scanning lines and the signal lines, and a substrate 10. The scanning lines, the signal lines, and the pixels are arranged on the substrate 10. Note that a light-shielding film 11 is formed on the back surface of the substrate 10.

Each of the pixels includes a pixel circuit 2 that receives a video signal in response to a control signal and that generates a driving current in accordance with the supplied video signal and a light-emitting device EL that emits light with luminance in accordance with the supplied video signal in response to the supplied driving current. The light-emitting device EL includes a pair of electrodes, that is, an anode A and a cathode K, and a light-emitting layer 14 sandwiched therebetween, and is therefore a two-terminal thin-film device. According to the present invention, at least one of the pair of electrodes is divided into at least two portions whereby the light-emitting device EL is divided into a pair of sub-light-emitting devices EL1 and EL2. In an example shown in FIG. 5, the anode A is divided into anodes A1 and A2 whereas the cathode K is commonly formed for the pixels. In a case where a short-circuit defect generated due to adhesion of a conductive contaminant particle 17 is found in the sub-light-emitting device EL1, the sub-light-emitting device EL1 is separated from the pixel circuit 2 so that the driving current is supplied only to the normal sub-light-emitting device EL2 whereby light emission with luminance in accordance with the video signal is maintained.

The divided electrodes A1 and A2 are connected to the pixel circuit 2 by lines. When the lines is broken by a laser beam emitted from outside of the substrate 10, the sub-light-emitting device EL1 in which the short-circuit defect is generated is disconnected from the pixel circuit 2. Note that the pixel circuit 2 is formed of a thin-film device including a thin-film transistor and a thin-film capacitor. Similarly to the above description, the thin-film device is covered with a planarization film 13, and the light-emitting device EL is formed on the planarization film 13.

Figure 6:
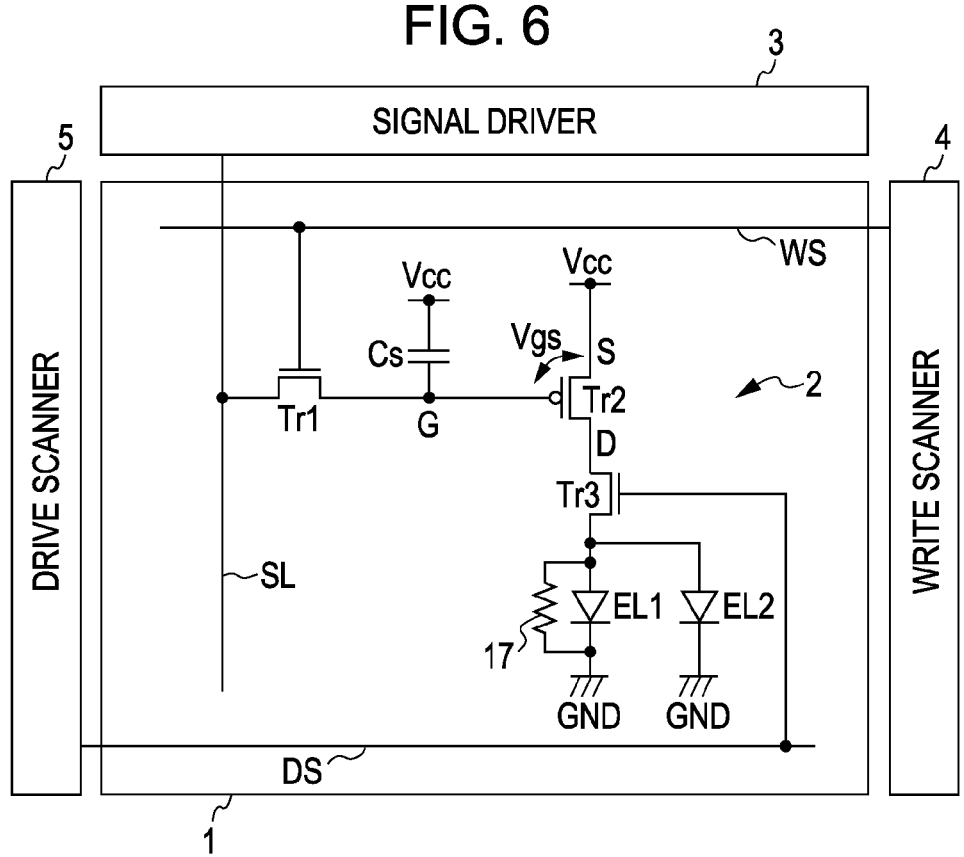
FIG. 6 is a circuit diagram used for explaining a display apparatus according to the embodiment of the present invention.

FIG. 6 is a circuit diagram showing a circuit configuration of the display apparatus according to the present invention shown in FIG. 5. Reference numerals the same as those shown in the pixel configuration of the reference example illustrated in FIG. 2 are used in FIG. 6 to denote the same components for simplicity. The configuration is basically the same as the pixel configuration of the reference example illustrated in FIG. 2, and the pixel circuit 2 includes a sampling transistor Tr1, a drive transistor Tr2, a switching transistor Tr3, and a hold capacitor Cs. The configuration shown in FIG. 6 is different from that shown in FIG. 2 in that the light-emitting device is divided into two portions, that is, the light-emitting device is constituted by the pair of sub-light-emitting devices EL1 and EL2. The sub-light-emitting device EL1 has an anode connected to the switching transistor Tr3 and a cathode connected to the ground. The sub-light-emitting device EL2 has an anode connected to the switching transistor Tr3 and a cathode connected to the ground, which is a similar configuration to the sub-light-emitting device EL1. In a case where both of the sub-light-emitting devices EL1 and EL2 are normal, a driving current supplied from the drive transistor Tr2 is divided and supplied to both of the sub-light-emitting devices EL1 and EL2. Accordingly, the total luminance of light emission of the sub-light-emitting devices EL1 and EL2 corresponds to the driving current.

Although, in this embodiment, a drive transistor is divided into two sub-light-emitting devices, the present invention is not limited to this. A drive transistor may be divided into three portions, four portions or more. As shown in the sectional view of the pixel circuit, an anode electrode in a pixel is divided into a plurality of portions (two portions in this embodiment). The divided anode electrodes are connected to the single drive transistor Tr2 through the switching transistor Tr3. The divided sub-light-emitting devices are connected to the common drive transistor Tr2 and a current value controlled by the drive transistor Tr2 is divided by two and currents of the divided current values are supplied to the sub-light-emitting devices. Luminance of light emission is independent of an area of light emission but depends on a supplied current value. Accordingly, the division of a light-emitting device into sub-light-emitting devices does not lead to deterioration of luminance. As described above, since the light-emitting device is divided into the sub-light-emitting devices, a dark spot defect may be corrected.

In this embodiment, a case where a pixel is divided into two subpixels is taken as an example. It is assumed that dust adhered to the sub-light-emitting device EL1 obtained by dividing the light-emitting device EL and therefore a dark spot defect occurred. An equivalent circuit of the pixel in this case is shown in FIG. 6. As shown in FIG. 5, a connection between the anode and the cathode of the sub-light-emitting device EL1 is short-circuited due to the dust (conductive contaminant particle) 17. Accordingly, in each of the sub-light-emitting devices EL1 and EL2, potentials of the anode and the cathode become substantially the same and therefore the current is hardly supplied to the light-emitting device EL resulting in generation of a dark spot. In the pixel circuit according to the present invention, however, the dark spot defect is corrected. For example, a TFT side line or an anode line of the sub-light-emitting device EL1, which is short-circuited due to the dust, is broken by a laser beam. By this, the sub-light-emitting device EL1 which is short-circuited enters a floating state and the sub-light-emitting device EL2 which is not short-circuited emits light. Here, since the amount of current supplied from the drive transistor Tr2 is not changed, luminance is not deteriorated even when only the sub-light-emitting device EL2, which has an area half that of the light-emitting device EL, is used for light emission. In this case, the amount of current per pixel area is increased. In a case where the sub-light-emitting device EL2 is short-circuited, similar processing is performed.

Figure 7:
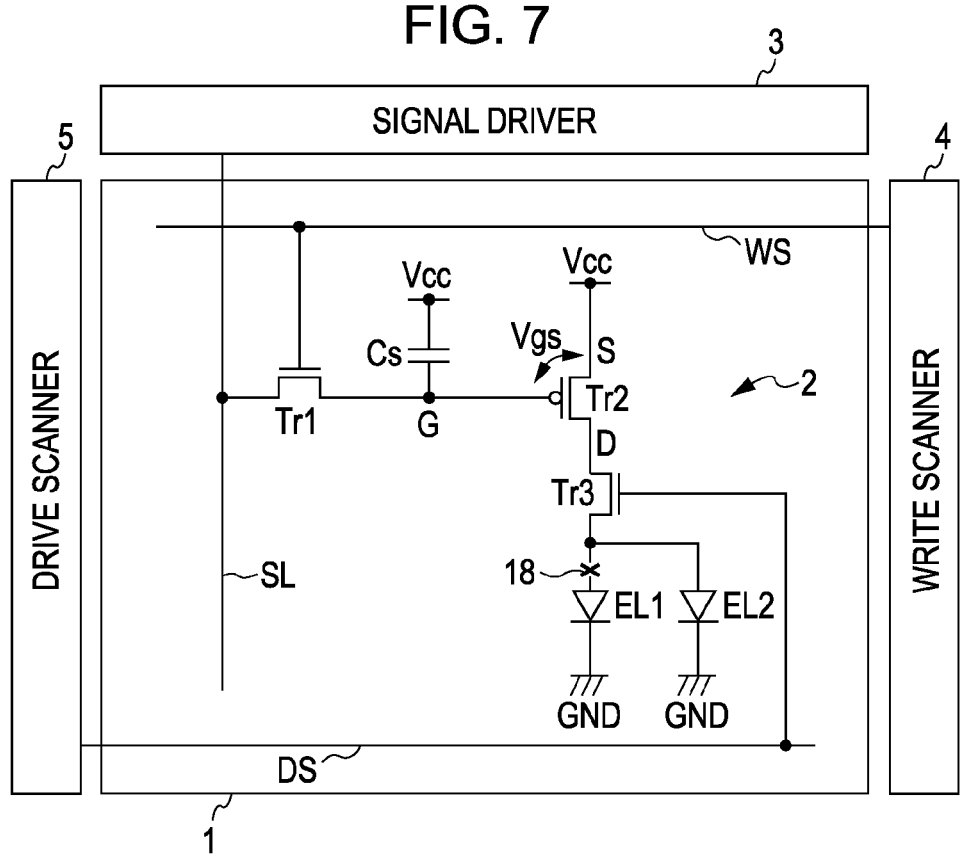
FIG. 7 is a circuit diagram used for explaining an operation of the display apparatus according to the embodiment shown in FIG. 6.

FIG. 7 is a schematic diagram illustrating a correction operation performed when a short-circuit defect is generated in the sub-light-emitting device EL1. It is assumed that dust adhered to the sub-light-emitting device EL1, which is obtained by dividing the light-emitting device EL, and therefore a short-circuit defect is generated. In this case, since most of the driving current supplied from the drive transistor Tr2 flows through the short-circuit defect portion to the ground potential GND, the pair of the sub-light-emitting devices EL1 and EL2 hardly emit light resulting in a dark spot defect. In order to address this problem, in the embodiment of the present invention, an anode line 18 of the sub-light-emitting device EL1 in which the short-circuit defect is generated is broken by a laser beam. Accordingly, the sub-light-emitting device EL1 in which the short-circuit defect is generated enters a floating state, and the driving current is entirely supplied to the normal sub-light-emitting device EL2 and the sub-light-emitting device EL2 emits light with predetermined luminance. Here, since the amount of a driving current supplied from the drive transistor Tr2 is not changed, the luminance is not deteriorated even when only the sub-light-emitting device EL2, which has an area half that of the light-emitting device EL which entirely emits light in a normal state, is used for light emission. On the other hand, in a case where a short-circuit defect is generated in the sub-light-emitting device EL2, the sub-light-emitting device EL2 is separated from the switching transistor Tr3, and only the normal sub-light-emitting device EL1 is used for light emission. Accordingly, a production yield of organic EL panels is markedly improved by correcting the dark spot defect using the laser beam as described above. Note that probability of generation of a short-circuit defect due to adhesion of a contaminant particle is extremely low, that is, one hundred-thousandth or one millionth. Therefore, probability of generation of short-circuit defects simultaneously in both of the pair of the sub-light-emitting devices EL1 and EL2 is extremely low. Consequently, a correction method of the embodiment is markedly effective in practical use for improvement of production yield. Generally, dust which is a cause of a dark spot is considerably small and therefore an area to which the dust adheres is considerably small when compared with an area of light emission. Accordingly, although a dark spot may be generated in one or more sub-light-emitting devices obtained by dividing a light-emitting device EL, probability of generation of dark spots in all of the sub-light-emitting devices due to dust is considerably low. That is, a light-emitting device is divided into a plurality of sub-light-emitting devices and the plurality of sub-light-emitting devices are connected to a common drive transistor. This makes it possible to correct a dark spot defect using a laser beam and to markedly improve production yield of an organic EL panel.

Figure 8:
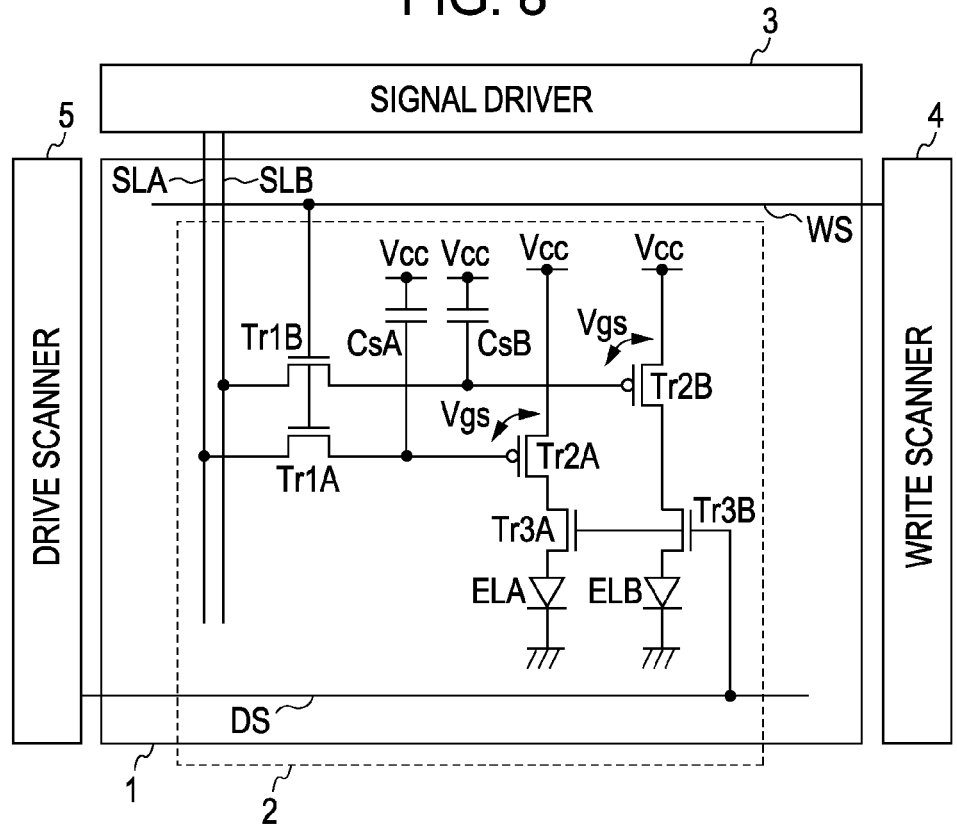
FIG. 8 is a circuit diagram illustrating a display apparatus according to a reference example.

FIG. 8 is a circuit diagram illustrating a display apparatus of a reference example. Reference numerals the same as those of the display apparatus shown in FIG. 6 are used in FIG. 8 to denote the same components for simplicity. As shown in FIG. 8, the display apparatus includes pixel circuits 2 and active devices for drive-controlling the pixel circuits 2. Each of the pixel circuits 2 includes a first subpixel and a second subpixel. The first and second subpixels have the same configuration, that is, the first and second subpixels constitute a redundant structure. One of the first and second subpixels includes a sampling transistor Tr1A, a drive transistor Tr2A, a switching transistor Tr3A, and a hold capacitor CsA. The other includes a sampling transistor Tr1B, a drive transistor Tr2B, a switching transistor Tr3B, and a hold capacitor CsB. In this reference example, each of the pixel circuits 2 is divided into a pair of subpixels whereas in the embodiment of the present invention, only each of the light-emitting devices is divided into a pair of sub-light-emitting devices.

Figure 9:
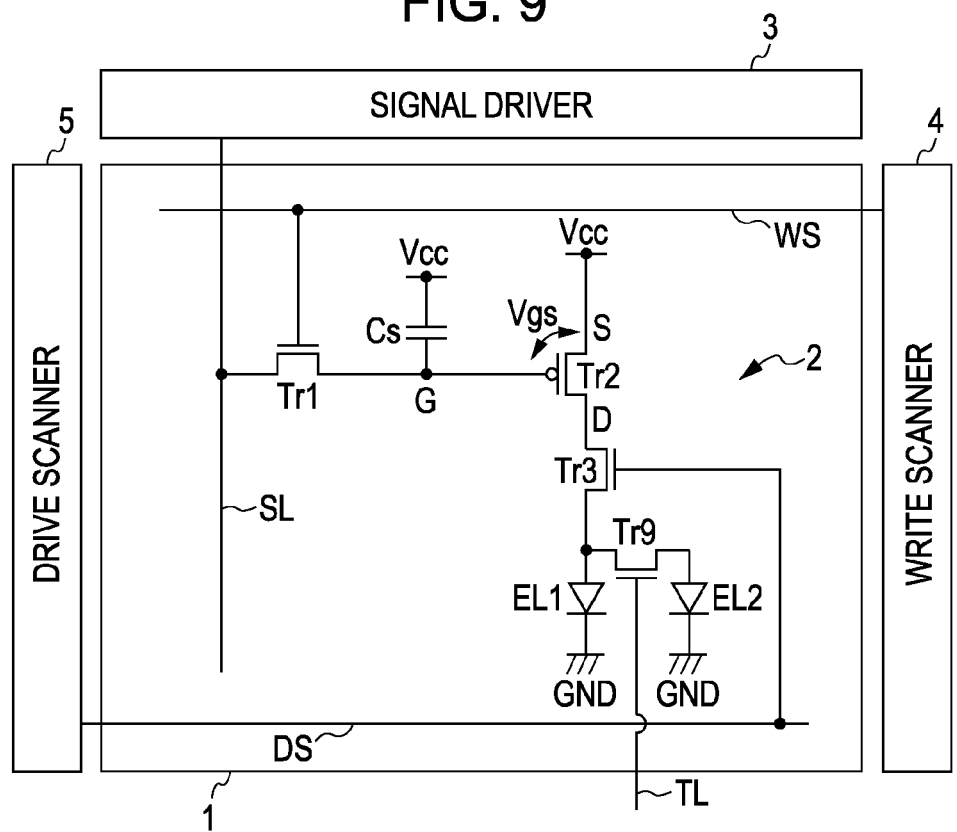
FIG. 9 is a circuit diagram illustrating a display apparatus according to another embodiment of the present invention.

FIG. 9 is a circuit diagram illustrating a modification of the display apparatus shown in FIG. 6 according to the present invention. Reference numerals the same as those of the display apparatus shown in FIG. 6 are used in FIG. 9 to denote the same components for simplicity. The display apparatus shown in FIG. 9 is different from that shown in FIG. 6 in that an additional transistor Tr9 is arranged between a sub-light-emitting device EL2 and a switching transistor Tr3. A gate of the additional transistor Tr9 is controlled using another one of a plurality of scanning lines TL. During a normal light emission period, when the one of the scanning lines TL is selected, the additional transistor Tr9 is turned on and the sub-light-emitting device EL2 is connected to the switching transistor Tr3.

In the embodiment illustrated in FIGS. 6 and 7, it is necessary to specify which of the pair of sub-light-emitting devices EL1 and EL2 includes a short-circuit defect using an optical microscope, for example. That is, it is necessary to specify which of the pair of sub-light-emitting devices EL1 and EL2 causes a dark spot defect of the pixel using an optical microscope. On the other hand, in the modification shown in FIG. 9, a sub-light-emitting device in which a short-circuit defect is generated is specified by utilizing the additional transistor Tr9. Specifically, while a driving current is supplied to the pixel causing a dark spot defect, the additional transistor Tr9 is turned off. In this state, when the pixel still causes the dark spot defect, it is determined that the sub-light-emitting device EL1 includes a short-circuit defect. On the other hand, when the dark spot defect is corrected, it is determined that the sub-light-emitting device EL2 includes a short-circuit defect. As described above, a sub-light-emitting device having a short-circuit defect is specified merely by turning on/off the additional transistor Tr9. A correction method performed after specifying the sub-light-emitting device having a short-circuit defect is the same as that of FIG. 7.

Figure 10:
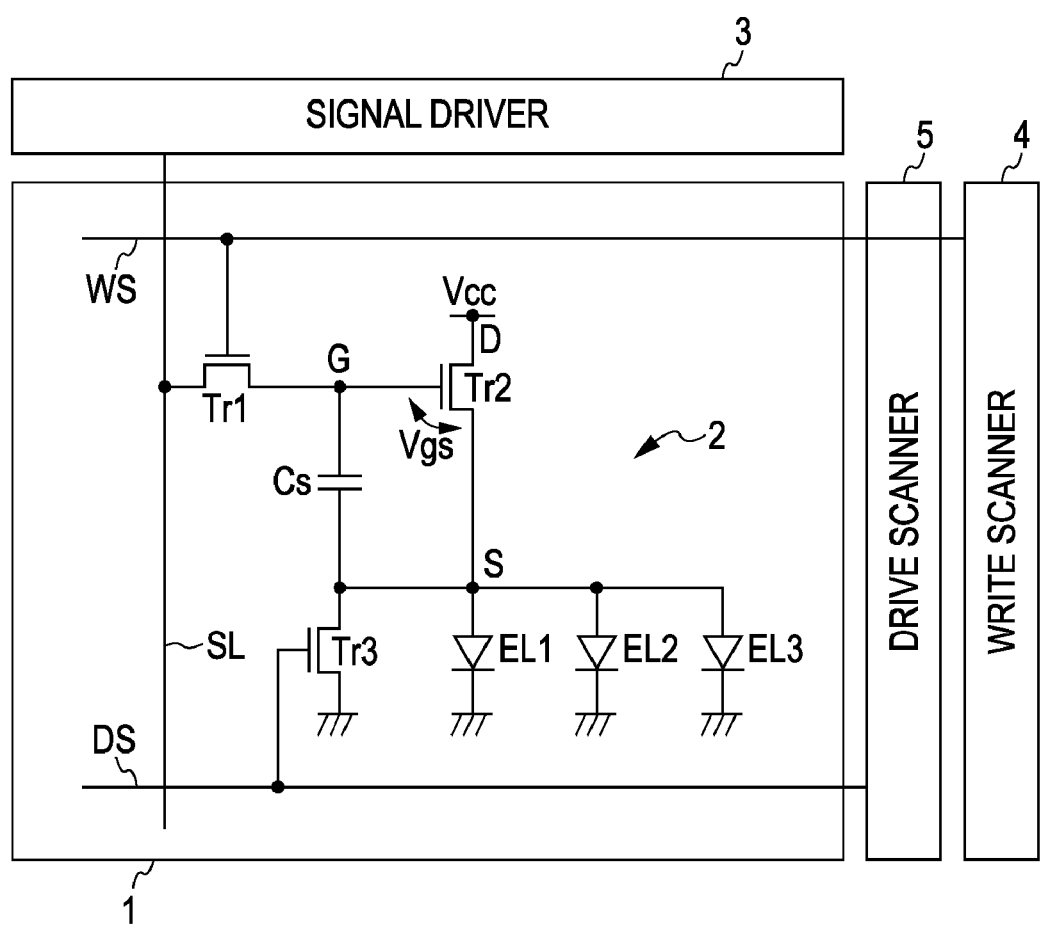
FIG. 10 is a circuit diagram illustrating a display apparatus according to still another embodiment of the present invention.

FIG. 10 is a circuit diagram illustrating another embodiment of a display apparatus according to the present invention. Reference numerals the same as those of the display apparatus shown in FIG. 6 are used in FIG. 10 to denote the same components for simplicity. This embodiment is the same as that shown in FIG. 6 in that a light-emitting device is divided, but a concrete configuration of pixel circuits 2 is different. As shown in FIG. 10, each of the pixel circuits 2 includes N-channel transistors Tr1, Tr2, and Tr3, and a hold capacitor Cs. A light-emitting device EL is connected between a source S of the drive transistor Tr2 and the ground potential GND. The light-emitting device EL is divided into a plurality of sub-light-emitting devices EL1, EL2, and EL3 according to this embodiment of the present invention. An anode of the sub-light-emitting device EL1 is connected to the source S of the drive transistor Tr2, and a cathode of the sub-light-emitting device EL1 is connected to the ground potential. Each of the other sub-light-emitting devices EL2 and EL3 has a configuration similar to that of the sub-light-emitting device EL1, that is, an anode of each of the sub-light-emitting devices EL2 and EL3 is connected to the source S of the drive transistor Tr2 and a cathode of each of the sub-light-emitting devices EL2 and EL3 is connected to the ground potential. The source S of the drive transistor Tr2 is connected to the drain of the switching transistor Tr3 and a first electrode of the hold capacitor Cs, and a gate G of the drive transistor Tr2 is connected to a second electrode of the hold capacitor Cs. The source of the switching transistor Tr3 is connected to a constant potential (the ground potential GND in this embodiment), and a gate of the switching transistor Tr3 is connected to a corresponding one of a plurality of scanning lines DS. A source and a drain of the sampling transistor Tr1 is connected between a corresponding one of a plurality of signal lines SL and the gate G of the drive transistor Tr2. The gate of the sampling transistor Tr1 is connected to a corresponding one of a plurality of scanning lines WS. Note that the drain D of the drive transistor Tr2 is connected to a power source potential Vcc.

According to this embodiment, since the source S of the drive transistor Tr2 is connected to the anodes of the sub-light-emitting devices EL1, EL2, and EL3, the drain D of the drive transistor Tr2 is connected to the power source potential Vcc, the hold capacitor Cs is connected between the gate G and the source S of the drive transistor Tr2, and a source potential of the drive transistor Tr2 is connected through the switching transistor Tr3 to the constant potential, the following advantages are obtained. That is, even if the I-V characteristic of the light-emitting device EL changes with time, it is possible to perform source follower output which realizes no deterioration of luminance. Accordingly, since the drive transistor Tr2 is configured as a source follower circuit, an N-channel transistor is used as a drive transistor Tr2 included in the light-emitting device EL while the anode and cathode electrodes which have been used so far in the drive transistor Tr2 are used. Accordingly, since the pixel circuit 2 includes only N-channel transistors, an a-Si process may be employed at the time of TFT production. Consequently, a production cost of a TFT substrate is reduced.

According to a detailed operation of the embodiment illustrated in FIG. 10, the sampling transistor Tr1 is turned on in a sampling period, video signals supplied from a signal driver 3 to the signal lines SL are subjected to sampling processing, and the sampled video signals are stored in the hold capacitor Cs. At this time, the switching transistor Tr3 is in an on-state, and the first electrode of the hold capacitor Cs is fixed to the ground potential GND. Then, when a light emission period is entered, a corresponding one of the scanning lines DS enters a non-selected state, and the switching transistor Tr3 is turned off. Consequently, the source S of the drive transistor Tr2 is separated from the ground potential GND, and the driving current is supplied to the light-emitting device EL in accordance with a gate potential Vgs stored in the hold capacitor Cs. Since the driving current is supplied, an anode potential of the light-emitting device EL is increased, and accordingly, a source potential of the drive transistor Tr2 is increased. Since the first electrode of the hold capacitor Cs is separated from the ground potential, a bootstrap operation is performed and the gate potential is increased in response to the increase in the source potential. Accordingly, the gate potential Vgs stored in the hold capacitor Cs is maintained constant. As described, the drive transistor Tr2 operates as a source follower constant current source, and a constant driving current obtained in accordance with the gate potential Vgs irrespective of change of the I-V characteristic of the light-emitting device EL may be supplied.

The present invention is applicable to various types of pixel circuit such as a pixel circuit employing a threshold-voltage correction method and a pixel circuit employing a mobility correction method which are driven by voltage, a pixel circuit driven by current, a current difference circuit, and a comparator circuit. For example, a pixel circuit shown in FIG. 11A includes four P-channel transistors Tr1 to Tr4, two capacitors Cs1 and Cs2, and a light-emitting device EL. The transistor Tr2 is a drive transistor, the transistors Tr3 and Tr4 are switching transistors, and a transistor Tr1 is a sampling transistor. A first current terminal (a source) of the drive transistor Tr2 is connected to a power source Vcc, and a second current terminal (a drain D) of the drive transistor Tr2 is connected to anodes of sub-light-emitting devices EL1 and EL2 through the switching transistor Tr3. Cathodes of the sub-light-emitting devices EL1 and EL2 are connected to the ground potential GND. A gate of the switching transistor Tr3 is connected to a corresponding one of the drain driving lines (scanning lines) DS arranged in parallel to scanning lines WS. The drain D of the drive transistor Tr2 is connected to a gate G of the drive transistor Tr2 through the switching transistor Tr4. A gate of the switching transistor Tr4 is connected to a corresponding one of a plurality of auto-zero lines AZ arranged in parallel to the scanning lines WS. A first current terminal of the sampling transistor Tr1 is connected to a first terminal of the hold capacitor Cs1 and a first terminal of the hold capacitor Cs2. A second terminal of the hold capacitor Cs1 is connected to a predetermined power source. A second terminal of the hold capacitor Cs2 is connected to the gate G of the drive transistor Tr2. A second current terminal of the sampling transistor Tr1 is connected to a corresponding one of a plurality of signal lines SL. Accordingly, the first current terminal of the sampling transistor Tr1 and a control terminal (a gate G) of the drive transistor Tr2 are AC-connected to each other through the hold capacitor Cs2. A gate of the sampling transistor Tr1 is connected to a corresponding one of the scanning lines WS.

Figure 11A:
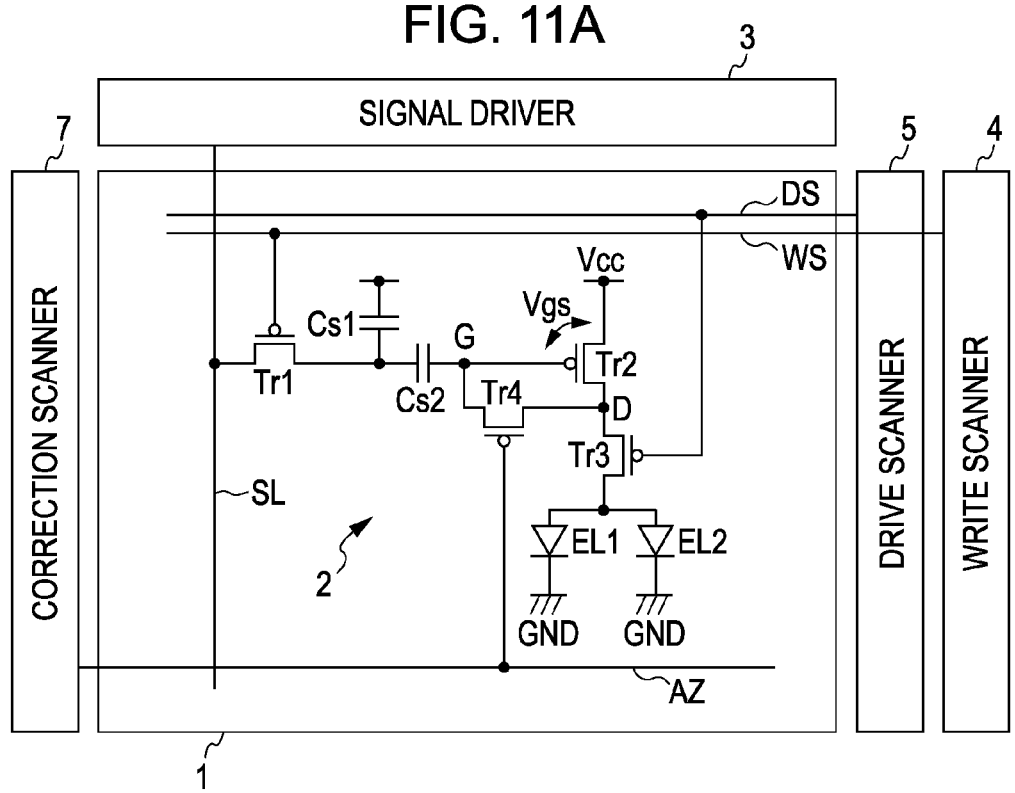
FIG. 11A is a circuit diagram illustrating a display apparatus according to yet another embodiment of the present invention.
Figure 11B:
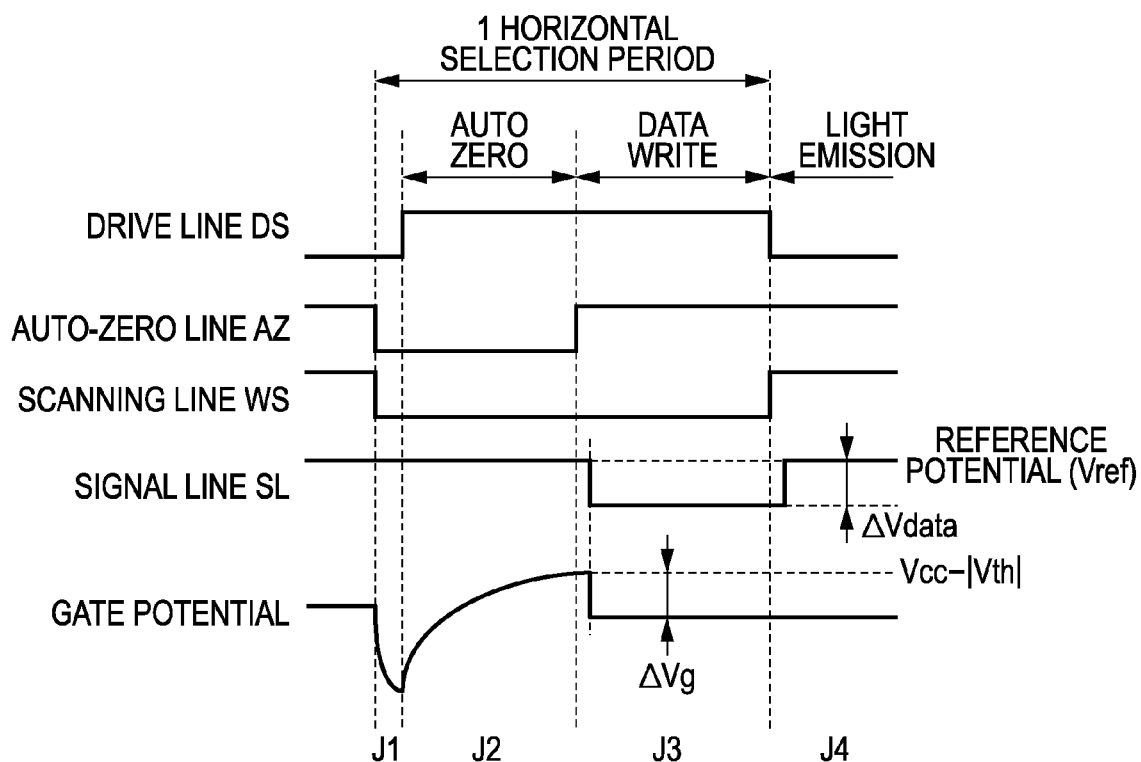
FIG. 11B is a timing chart used for explaining an operation of the display apparatus shown in FIG. 11A.

FIG. 11B shows a timing chart used for explaining an operation of the pixel circuit shown in FIG. 11A. The timing chart illustrates voltage changes (that is, waveforms of control signals) of the corresponding one of the scanning lines DS, the corresponding one of the auto-zero lines AZ, and the corresponding one of the scanning lines WS connected to control terminals (gates) of the transistors Tr3, Tr4, and Tr1, respectively. In addition, the timing chart illustrates a change of a signal potential of one of the signal lines SL and a waveform of a change of a gate potential of the drive transistor Tr2.

In a first preparation period J1, potentials of the corresponding one of the scanning lines DS and the corresponding one of the auto-zero lines AZ are in low level states, and thereby the transistors Tr3 and Tr4 are brought into conductive states. At this time, since the drive transistor Tr2 is diode-connected to the light-emitting device EL, a drain current is supplied to the transistor Tr2.

In a successive auto-zero period J2, a potential of the corresponding one of the scanning lines DS is changed to a high level state, and thereby the switching transistor Tr3 is brought into a non-conductive state. At this time, the corresponding one of the scanning lines WS is in a low level state, and thereby the sampling transistor Tr1 is brought into a conductive state and a reference potential Vref is supplied to the corresponding one of the signal line. Since the current supplied to the drive transistor Tr2 is blocked, a gate potential of the drive transistor Tr2 is increased. When the gate potential of the drive transistor Tr2 is increased up to a value of Vcc−|Vth|, the drive transistor Tr2 is brought into a non-conductive state and a stable potential is achieved. This operation is referred to as an "auto-zero operation". The auto-zero operation is performed in order to write a voltage corresponding to a threshold voltage Vth of the drive transistor Tr2 to the gate G of the drive transistor Tr2.

Then, in a data writing period J3, the corresponding one of the auto-zero lines AZ is changed to a high level state, and thereby the switching transistor Tr4 is brought into a non-conductive state. In addition, the potential of the corresponding one of the signal lines is changed to a potential lower than the value Vref by a signal voltage ΔVdata. This change in the signal line potential lowers the gate potential of the drive transistor Tr2 by a value of ΔVg through the capacitor Cs2.

In a light emission period J4, the corresponding one of the scanning lines WS is changed to a high level state and thereby the sampling transistor Tr1 is brought into a non-conductive state, and the corresponding one of the scanning lines DS is changed to a low level state and thereby the switching transistor Tr3 is brought into a conductive state. Accordingly, an output current is supplied to the drive transistor Tr2 and the light-emitting device EL whereby the sub-light-emitting devices EL1 and EL2 emit light.

In the data writing period J3, when it is assumed that a parasitic capacitance is ignored, the value ΔVg and the gate potential Vg of the drive transistor Tr2 are denoted by the following equations (1) and (2).

$$\Delta Vg = \Delta Vdata \times Cs1/(Cs1+Cs2) \quad (1)$$

$$Vg = Vcc - |Vth| - \Delta Vdata \times Cs1/(Cs1+Cs2) \quad (2)$$

A value of the current (hereinafter referred to as a current Ioled) supplied to the light-emitting device EL in the light emission period J4 is controlled using the drive transistor Tr2 connected to the sub-light-emitting devices EL1 and EL2 in series. It is assumed that the drive transistor Tr2 operates in a saturation region, using the well-known characteristic equation (1) of the MOS transistor and the equation (2) described above, the current Ioled is denoted as the following equation (3).

$$Ioled = \mu \cdot Cox(W/L)(1/2)(Vcc - Vg - |Vth|)^2 \quad (3)$$
$$= \mu \cdot Cox(W/L)(1/2)(\Delta Vdata \times Cs1/(Cs1+Cs2))^2$$

where μ denotes a mobility of majority carriers of the drive transistor Tr2, Cox denotes a gate capacitance per unit area, W denotes a gate width, and L denotes a gate length. According to the equation (3), Ioled is independent of the threshold voltage Vth of the drive transistor Tr2 but is controlled by the signal voltage ΔVdata externally supplied. In other words, use of the pixel circuit shown in FIG. 11A realizes a display apparatus which is independent of threshold voltages Vth of a drive transistor varying for each pixel and which has comparatively high current uniformity and luminance uniformity.

Figure 12:
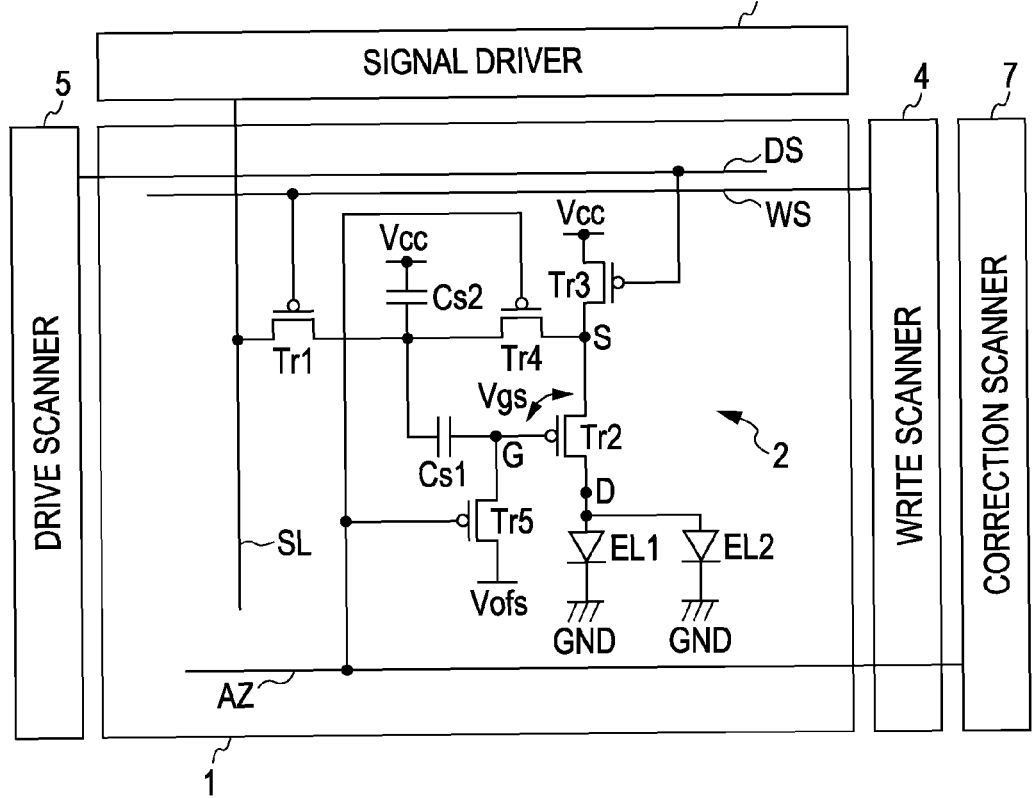
FIG. 12 is a circuit diagram illustrating a display apparatus according to a further embodiment of the present invention.

The present invention is similarly applicable to a pixel circuit having a function of correcting variation of a threshold voltage Vth of a drive transistor. FIG. 12 is a circuit diagram illustrating an embodiment of a pixel circuit having a function of correcting variation of a threshold voltage Vth of a drive transistor. Reference numerals the same as those shown in FIG. 2 are used in FIG. 12 to denote the same components for simplicity. As shown in FIG. 12, a pixel circuit of this embodiment includes five P-channel transistors Tr1 to Tr5, two pixel capacitors Cs1 and Cs2, and two sub-light-emitting devices EL1 and EL2. The pixel circuit includes a sampling transistor Tr1 as a basic transistor device, a drive transistor Tr2, a switching transistor Tr3 used for luminous control, and switching transistors Tr4 and Tr5 used to correct a threshold voltage Vth. Each of the switching transistors Tr4 and Tr5 is controlled using a correction scanner 7 through a corresponding one of a plurality of scanning lines (auto-zero lines) AZ, the threshold voltage Vth of the drive transistor Tr2 is detected before video signals are subjected to sampling processing, and a voltage corresponding to the detected threshold voltage Vth is held in the hold capacitor Cs1. Accordingly, the threshold voltage Vth of the drive transistor Tr2 is cancelled. By this, even though the threshold voltage Vth of the drive transistor Tr2 is varied for each pixel, the influence from the variation may be cancelled.

Figure 13:
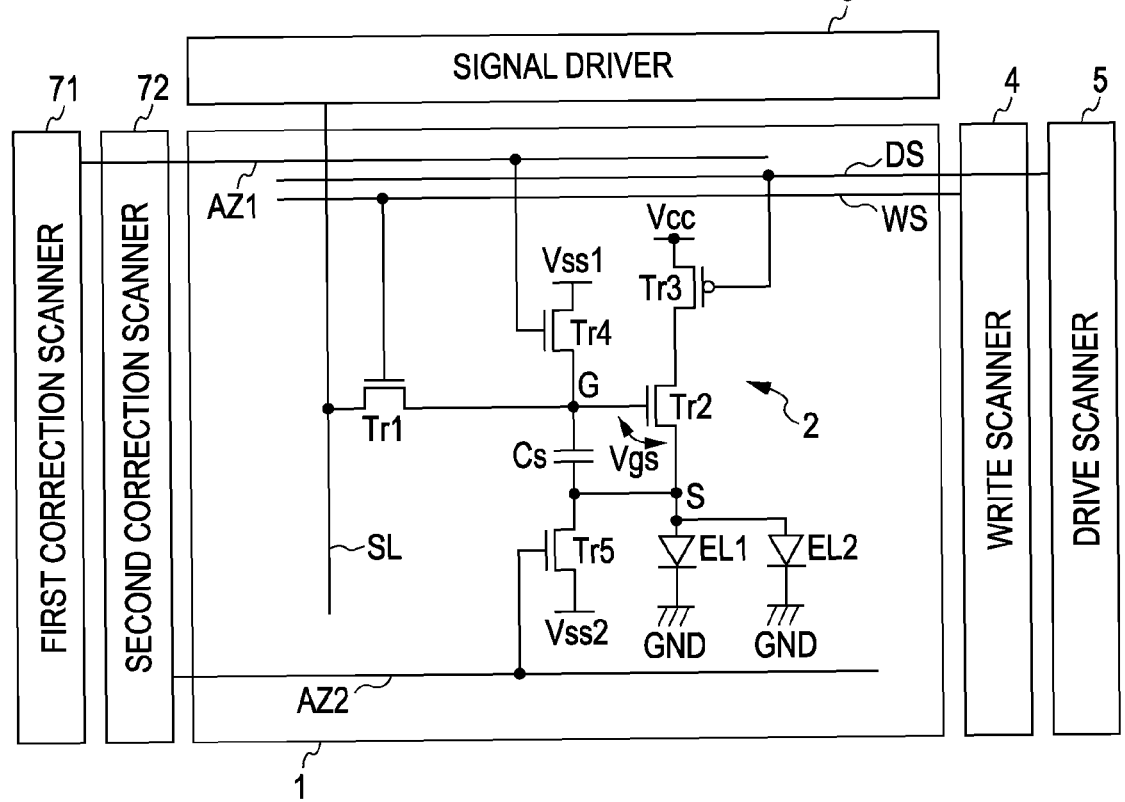
FIG. 13 is a circuit diagram illustrating a display apparatus according to a further embodiment of the present invention.

Furthermore, the present invention is applicable to a pixel circuit having a function of correcting variations of a threshold voltage Vth and a mobility μ of a drive transistor. FIG. 13 is a circuit diagram illustrating a pixel circuit having a function of correcting variations of a threshold voltage Vth and a mobility μ of a drive transistor according to an embodiment of the present invention. A pixel circuit 2 includes five thin-film transistors Tr1 to Tr5, a hold capacitor (a pixel capacitor) Cs, and a light-emitting device EL including sub-light-emitting devices EL1 and EL2. The transistors Tr1, Tr2, Tr4 and Tr5 are N-channel polysilicon TFTs. Only the transistor Tr3 is a P-channel polysilicon TFT. The hold capacitor Cs constitutes a pixel capacitor of the pixel circuit 2. Each of the light-emitting devices EL1 and EL2 is a diode organic EL device having an anode and a cathode, for example. Note that the present invention is not limited to this, but each of the light-emitting devices may be any device which emits light by driving a current.

The drive transistor Tr2 which is a main portion of the pixel circuit 2 has a gate G connected to one terminal of the pixel capacitor Cs and has a source S connected to the other terminal of the pixel circuit Cs. The gate G of the drive transistor Tr2 is connected to a reference potential Vss1 through the switching transistor Tr4. A drain of the drive transistor Tr2 is connected to a power source Vcc through the switching transistor Tr3. The gate of the switching transistor Tr4 is connected to a corresponding one of a plurality of scanning lines AZ1, and a gate of the switching transistor Tr3 is connected to a corresponding one of a plurality of scanning lines DS. An anode of each of the sub-light-emitting devices EL1 and EL2 is connected to the source S of the drive transistor Tr2, and a cathode of each of the sub-light-emitting devices EL1 and EL2 is connected to the ground. The ground potential may be referred to as ground potential Vcath hereinafter. The switching transistor Tr5 is connected between the source S of the drive transistor Tr2 and a predetermined reference potential Vss2. A gate of the switching transistor Tr5 is connected to a corresponding one of a plurality of scanning lines AZ2. The sampling transistor Tr1 is connected between a corresponding one of a plurality of signal lines SL and the gate G of the drive transistor Tr2. A gate of the sampling transistor Tr1 is connected to a corresponding one of a plurality of scanning lines WS.

In this configuration, the sampling transistor Tr1 is brought into a conduction state in response to a control signal WS supplied from the corresponding one of the scanning lines WS, performs sampling processing on a video signal Vsig supplied from the corresponding one of the signal lines SL, and supplies the sampled signal to the pixel capacitor Cs. The pixel capacitor Cs applies an input voltage Vgs between the gate G and the source S of the drive transistor Tr2 in response to the sampled video signal Vsig. The drive transistor Tr2 supplies an output current Ids in accordance with the input voltage Vgs to the light-emitting device EL in the predetermined light emission period. Note that the output current (a drain current) Ids depends on a threshold voltage Vth and a carrier mobility μ in a channel area of the drive transistor Tr2. The output current Ids supplied from the drive transistor Tr2 drives the light-emitting device EL so as to emit light with luminance in accordance with the video signal Vsig.

According to this embodiment, each of the pixel circuits 2 includes a correction unit constituted by the switching transistors Tr3 and Tr4. The correction unit corrects the input voltage Vgs stored in the pixel capacitor Cs in an earlier stage of a light emission period in advance in order to cancel a dependency of the output current Ids on the carrier mobility μ. Specifically, the correction unit (the switching transistors Tr3 and Tr4) operates in a part of the sampling period in accordance with the control signals WS and DS supplied from the corresponding one of the scanning lines WS and the corresponding one of the scanning lines DS, respectively, and corrects the input voltage Vgs by obtaining the output current Ids from the drive transistor Tr2 after the video signal Vsig is subjected to the sampling processing, and by performing a negative feedback on the output current Ids to be supplied to the pixel capacitor Cs. The correction unit (the switching transistors Tr3 and Tr4) detects the threshold voltage Vth of the drive transistor Tr2 and adds the detected threshold voltage Vth to the input voltage Vgs before entering the sampling period in order to cancel the dependency of the output current Ids on the threshold voltage Vth.

In this embodiment, the drain of the N-channel drive transistor Tr2 is connected to the power source Vcc, and the source S thereof is connected to the light-emitting device EL. In this case, the correction unit obtains the output current Ids from the drive transistor Tr2 in the earlier stage of the light emission period which is overlapped with a later stage of the sampling period and performs negative feedback to supply the output current Ids to the pixel capacitor Cs. At this time, the correction unit controls the output current Ids obtained from the source S of the drive transistor Tr2 to be supplied to a capacitor included in the light-emitting device EL in the earlier stage of the light emission period. Specifically, the light-emitting device EL is a diode light-emitting device having an anode and a cathode. The anode thereof is connected to the source S of the drive transistor Tr2 and the cathode thereof is connected to the ground. In this configuration, the correction unit (the switching transistors Tr3 and Tr4) sets the anode and the cathode of the light-emitting device EL to a reverse-bias state. Accordingly, when the output current Ids obtained from the source S of the drive transistor Tr2 is supplied to the light-emitting device EL, the diode light-emitting device EL functions as a capacitor element. A duration t for obtaining the output current Ids from the drive transistor Tr2 in the sampling period using the correction unit is adjustable, and accordingly, the amount of the negative feedback of the output current Ids for the pixel capacitor Cs is optimized.

Figure 14:
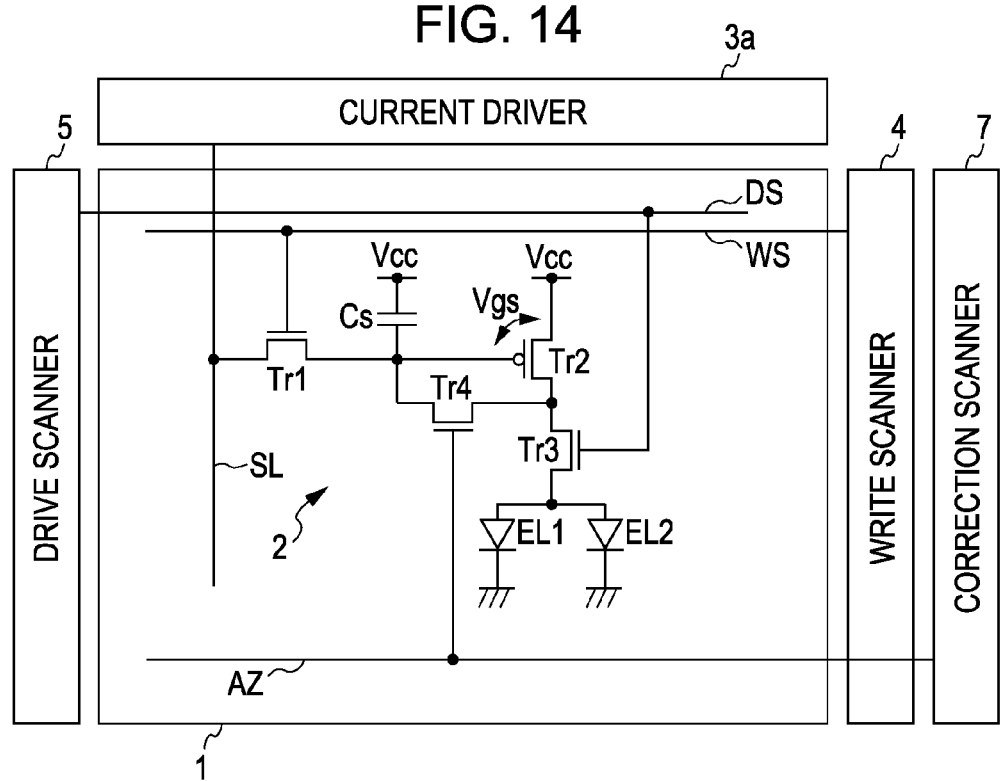
FIG. 14 is a circuit diagram illustrating a display apparatus according to a still further embodiment of the present invention.

The present invention is applicable to a pixel circuit driven by a current. FIG. 14 is a circuit diagram illustrating an embodiment of a pixel circuit driven by a current. As show in FIG. 14, each of a plurality of pixels includes a pixel circuit 2 and a light-emitting device EL having sub-light-emitting devices EL1 and EL2. The pixel circuit 2 includes an N-channel sampling transistor Tr1, P-channel drive transistor Tr2, N-channel switching transistors Tr3 and Tr4, and a hold capacitor Cs. The transistors Tr1 to Tr4 are thin-film transistors (TFTs) and the hold capacitor Cs is a thin-film capacitor element. Each of the sub-light-emitting devices EL1 and EL2 has a pair of electrodes, that is, an anode A and a cathode K, and a light-emitting layer, and therefore is a two-terminal thin-film device.

A source S of the P-channel drive transistor Tr2 is connected to a power source Vcc. A drain D of the P-channel drive transistor Tr2 is connected to the anode of each of the sub-light-emitting devices EL1 and EL2 through the N-channel switching transistor Tr3. A gate of the N-channel switching transistor Tr3 is connected to the drive scanner 5 through a corresponding one of the scanning lines DS. The cathode of each of the sub-light-emitting devices EL is connected to the ground potential GND. A gate G of the drive transistor Tr2 is connected to a corresponding one of a plurality of signal lines SL through the sampling transistor Tr1. The signal lines SL are connected to a current driver 3a. A gate of the sampling transistor Tr1 is connected to a write scanner 4 through a corresponding one of a plurality of scanning lines WS. The hold capacitor Cs is connected between the gate of the drive transistor Tr2 and the power source Vcc. The switching transistor Tr4 is connected between the gate and drain of the drive transistor Tr2. A gate of the switching transistor Tr4 is connected to a correction scanner 7 through a corresponding one of the scanning lines AZ.

An operation of the pixel circuit driven by a current will now be described. In a state in which the corresponding one of the scanning lines DS is in a low level state, the corresponding one of the scanning lines WS and the corresponding one of the auto-zero lines AZ are set to high level states. Accordingly, the switching transistor Tr3 is in an off state whereas the sampling transistor Tr1 and the switching transistor Tr4 are turned on. The current driver 3a supplies a signal current Isig by driving the corresponding one of the signal lines SL. Consequently, the signal current Isig is supplied from the power source Vcc through the drive transistor Tr2, the switching transistor Tr4, and the sampling transistor Tr1 to the corresponding one of the signal lines SL. At this time, a gate voltage Vgs generated between the source and drain of the drive transistor Tr2 is written to the pixel capacitor Cs. Thereafter, the corresponding one of the scanning lines WS and the corresponding one of the auto-zero lines AZ return to low level states, and the gate potential Vgs is held in the pixel capacitor Cs. Then, the corresponding one of the scanning lines DS is changed to a high level state, and thereby the switching transistor Tr3 is turned on. Accordingly, a driving current Ids is supplied from the power source Vcc through the drive transistor Tr2 and the switching transistor Tr3 to the sub-light-emitting devices EL1 and EL2. A value of the driving current Ids is determined on the basis of the gate voltage Vgs. Here, the gate voltage Vgs has been written to the pixel capacitor Cs in advance by supplying the signal current Isig. Accordingly, the driving current Ids is the same as the signal current Isig. In this pixel circuit, the sub-light-emitting devices EL1 and EL2 are driven by the signal current Isig.

Figure 15:
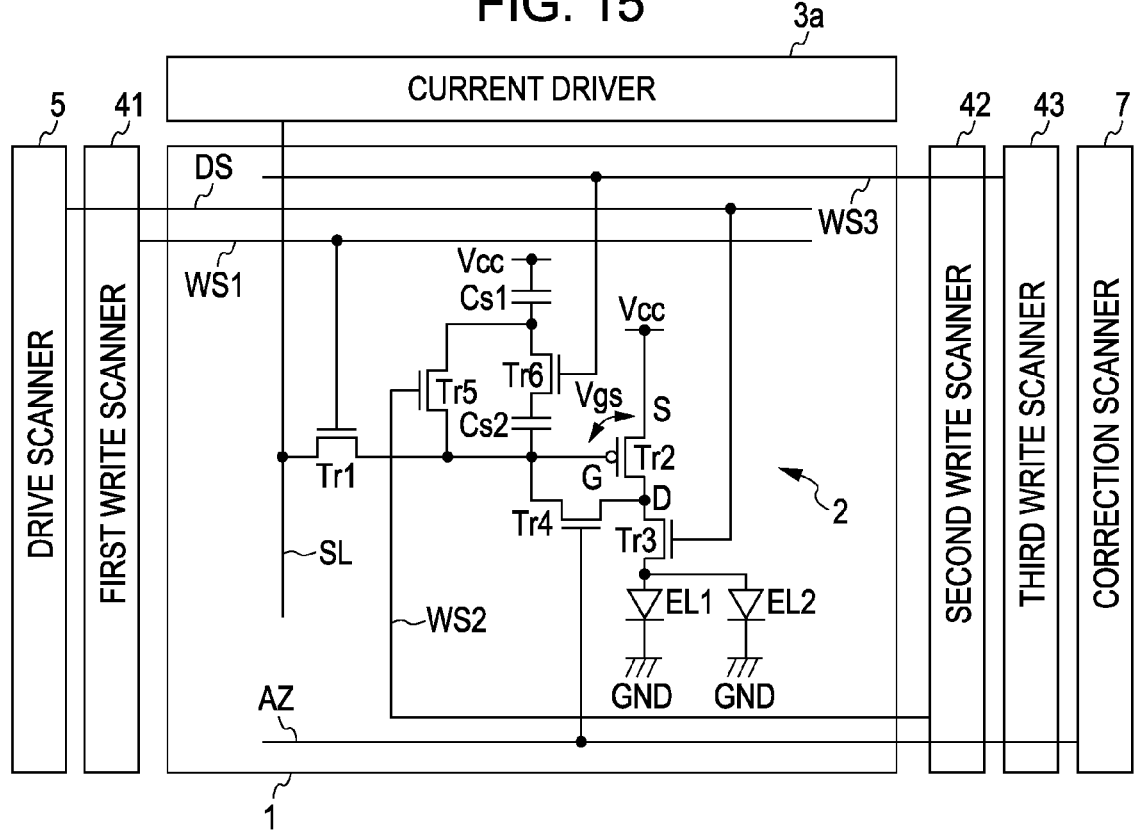
FIG. 15 is a circuit diagram illustrating a display apparatus according to a yet further embodiment of the present invention.

FIG. 15 shows an example of a pixel circuit driven by a current difference. Each of a plurality of the pixel circuits 2 includes six thin-film transistors Tr1 to Tr6, two pixel capacitors Cs1 and Cs2, and a light-emitting element EL including two sub-light-emitting devices EL1 and EL2. The transistors Tr1, Tr3, Tr4, Tr5, and Tr6 are N-channel switching transistors. The transistor Tr2 is a P-channel drive transistor for driving the sub-light-emitting devices EL1 and EL2. In this embodiment, the six thin-film transistors Tr1 to Tr6 have channel regions formed of low-temperature polysilicon thin film. The light-emitting device EL is a two-terminal device including an anode and a cathode, and formed of an organic EL light-emitting device, for example. Note that, in this embodiment, the transistors Tr1, Tr3, Tr4, Tr5, and Tr6 are N-channel transistors. However, the transistors Tr1, Tr3, Tr4, Tr5, and Tr6 may be P-channel transistors or may be a combination of N-channel transistors and P-channel transistors.

A source S of the drive transistor Tr2 is connected to a power source Vcc. A drain D of the drive transistor Tr2 is connected to an anode of each of the sub-light-emitting devices EL1 and EL2. A cathode of each of the sub-light-emitting devices EL1 and EL2 is connected to the ground. A gate G of the drive transistor Tr2 is connected to a first terminal of the pixel capacitor Cs2, and a second terminal of the pixel capacitor Cs2 is connected to a first terminal of the pixel capacitor Cs1, and a second terminal of the pixel capacitor Cs1 is connected to the power source Vcc.

A source and drain of the sampling transistor Tr1 are connected to a corresponding one of a plurality of signal lines SL and the gate G of the drive transistor Tr2, respectively. A gate of the sampling transistor Tr1 is connected to a first write scanner 41 through a corresponding one of a plurality of scanning lines WS1. A source and drain of the switching transistor Tr5 are connected to the gate G of the drive transistor Tr2 and the first terminal of the pixel capacitor Cs1, respectively. A gate of the switching transistor Tr5 is connected to a second write scanner 42 through a corresponding one of a plurality of scanning lines WS2. A source and drain of the switching transistor Tr6 are connected to the pixel capacitors Cs1 and Cs2, respectively. A gate of the switching transistor Tr6 is connected to a third write scanner 43 through a corresponding one of a plurality of scanning lines WS3. A source and drain of the switching transistor Tr4 are connected to the gate G and the drain D of the drive transistor Tr2, respectively. A gate of the switching transistor Tr4 is connected to a correction scanner 7 through a corresponding one of a plurality of scanning lines AZ. A source and drain of the switching transistor Tr3 are connected to the drain D of the drive transistor Tr2 and the anode of the light-emitting device EL, respectively. A gate of the switching transistor Tr3 is connected to a drive scanner 5 through a corresponding one of a plurality of scanning lines DS.

As described above, the pixel circuits shown in FIG. 15 are arranged so as to correspond to intersections of the scanning lines WS1, WS2, WS3, AZ, and DS which supply control signals. Each of the pixel circuits 2 includes the sub-light-emitting devices EL1 and EL2, the drive transistor Tr2 which supply the driving current Ids to the sub-light-emitting devices EL1 and EL2, a controller that operates in accordance with the control signals WS1, WS2, WS3, AZ, and DS and that controls the driving current Ids supplied from the drive transistor Tr2 in accordance with the signal current Isig. The controller includes a first sampling unit, a second sampling unit, and a difference unit. The first sampling unit includes the transistors Tr1, Tr6, and Tr4, and a pixel capacitor C2, and performs sampling processing on the signal current Isig supplied to each of the signal lines SL. The second sampling unit includes the transistors Tr1, Tr5, Tr6, and Tr4, and the pixel capacitor Cs1, and performs sampling processing on a predetermined reference current Iref supplied to each one of the signal lines SL about the time the signal current Isig is subjected to the sampling processing. The difference unit includes the transistors Tr1, Tr6, and Tr4, and the pair of the pixel capacitors Cs1 and Cs2, and generates a control voltage (Vref-Vsig)/2 in accordance with a difference between the sampled reference current Iref and the sampled signal current Isig. The drive transistor Tr2 receives the control voltage (Vref-Vsig)/2 at the gate G thereof and supplies the driving current Ids flowing between the source S and drain D to the light-emitting device EL to perform emission of light.

When a relative difference between the signal current Isig and the reference current Iref which are sampled using the first and second sampling units, respectively, is small, the amount of light emission by the sub-light-emitting devices EL1 and EL2 becomes small whereas when the relative difference is large, the amount of light emission becomes large. However, even when the relative difference is small, absolute levels of the signal current Isig and the reference current Iref are set to be large so as to be subjected to the sampling processing.

The controller of the pixel circuit 2 includes a correction unit in addition to the first and second sampling units and the difference unit described above. The correction unit includes the switching transistors Tr5 and Tr4, and the pixel capacitor Cs1. The correction unit detects a threshold voltage Vth of the drive transistor Tr2 and adds the detected threshold voltage Vth to the control voltage (Vref−Vsig)/2. Accordingly, the influence of the threshold voltage Vth on the driving current Ids is cancelled.

FIG. 16 is a diagram schematically showing another pixel circuit in which a correction function is employed. As shown in FIG. 16, pixel circuits 2 are arranged so as to correspond to intersections of signal lines SL1 and SL2 and control lines WS, RS, and SWP. Each of the pixel circuits 2 includes five transistors Tr1 to Tr5 and a pixel capacitor (a coupling capacitor) Cs and drives sub-light-emitting devices EL1 and EL2. A gate of the transistor Tr1 is connected to a corresponding one of the control lines WS and a gate of the transistor Tr2 is connected to a corresponding one of the control lines SWP. A gate of the transistor Tr3 is connected to a corresponding one of the control line RS. The transistors Tr4 and Tr5 constitute an inverter element. The transistor Tr3 is connected between an input node B and an output node C of the inverter element. The sub-light-emitting devices EL1 and EL2 are also connected to the output node C of the inverter element. Video signals are supplied from a driver not shown to the signal lines SL1. Similarly, sweep signals are supplied from a driver not shown to the signal lines SL2.

FIG. 17 shows waveforms of a sweep signal, and control signals WS, RS, and SWP which are supplied from a scanner. Note that the control signals are denoted by reference symbols the same as those of the corresponding control lines for simplicity. As shown in FIG. 17, the sweep signal has a waveform which sweeps in a reciprocating manner within a predetermined high potential and a predetermined low potential with a video signal potential as a center.

When the control signal WS enters a high level state, the transistor Tr1 is turned on. Substantially simultaneously, the control signal RS enters a high level state, and this triggers transistor Tr3 to turn on. When the transistor Tr1 is turned on, a signal potential is written to a node A. On the other hand, when the transistor Tr3 is turned on, the input node B and the output node C of the inverter element constituted by the transistors Tr4 and Tr5 become connected to each other. A potential of the input node B is determined on the basis of a split ratio of a channel resistor of the transistors Tr4 and Tr5. Generally, the potential of the input node B is set so as to be an intermediate value of a power source potential Vcc and the ground potential GND.

Then, the control signals WS and RS are changed to low level states, and the transistors Tr1 and Tr3 are turned off. Thereafter, the control signal SWP enters a high level state and this triggers the transistor Tr2 to turn on. At this time, a sweep signal is supplied from a corresponding one of the signal lines SL2. In a case where a potential of the sweep signal is larger than the signal potential stored in the node A, the potential stored in the node A is increased, and a positive coupling potential is supplied to the input node B through the coupling capacitor Cs. On the other hand, in a case where the potential of the sweep signal is lower than the signal potential stored in the node A, a negative coupling potential is supplied to the input node B through the coupling capacitor Cs. When the positive coupling potential is supplied, the transistor Tr5 of the inverter element is turned on, and the ground potential is supplied to the output node C, and therefore the sub-light-emitting devices EL1 and EL2 do not emit light. On the other hand, when the negative coupling potential is supplied, the transistor Tr4 of the inverter element is turned on, and the power source potential Vcc is supplied to the output node C, and therefore the sub-light-emitting devices EL1 and EL2 emit light. As described above, the sub-light-emitting devices EL1 and EL2 emit light when driven by a constant voltage, and a light emission period is determined by comparing the signal potential of the video signal and the potential of the sweep signal. In other words, the inverter element constituted by the pair of transistors modulates the signal potential of the video signal into a light emitting duration whereby a predetermined gradation display is realized. In this method, since the driving current supplied to the sub-light-emitting devices EL1 and EL2 is not influenced by variations in the characteristics of the transistors included in each of the pixel circuits, a uniform and high-quality image may be obtained. That is, the comparator-type pixel circuit employing the inverter element shown in FIG. 16 is capable of cancelling influences of the threshold voltage and the mobility of the transistor by converting the signal potential of the video signal into the light emitting duration.

Figure 18:
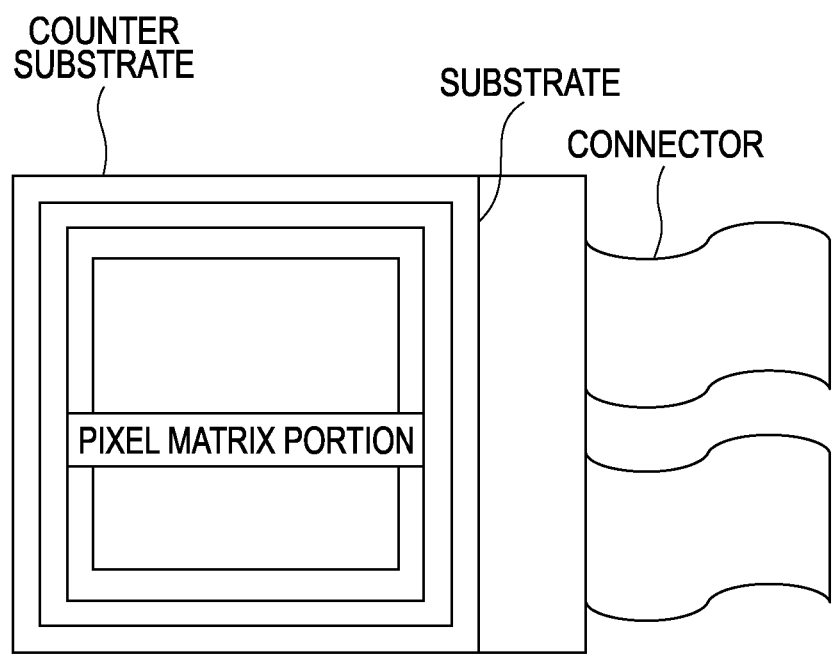
FIG. 18 is a plan view illustrating a module configuration of an example of a display apparatus according to the embodiments of the present invention.

The display apparatus according to the present invention includes a flat-module display apparatus shown in FIG. 18. For example, a pixel array portion configured such that pixels are integrated and arranged in a matrix is disposed on an insulating substrate. Each of the pixels includes an organic EL device, a thin-film transistor, and a thin-film capacitor. A bonding material is arranged so as to surround the pixel array portion (a pixel matrix portion), and a counter substrate such as a glass substrate is attached to the insulating substrate by the bonding material whereby a display module is formed. The transparent counter substrate may be provided with a color filter, a protective film, and a light-shielding film as needed. The display module may include a connector used for receiving/supplying signals from/to outside of the pixel array portion, such as an FPC (flexible printed circuit).

The above-described display apparatus according to the present invention has a flat-panel, and is applicable as a display apparatus to various electronic apparatuses in various fields, such as a digital still camera, a laptop personal computer, a cellular phone, and a video camera, which are capable of displaying video signals input to or generated in the electronic apparatuses as images or as video images. Examples of a display apparatus employing such a display apparatus will be described hereinafter.

Figure 19:
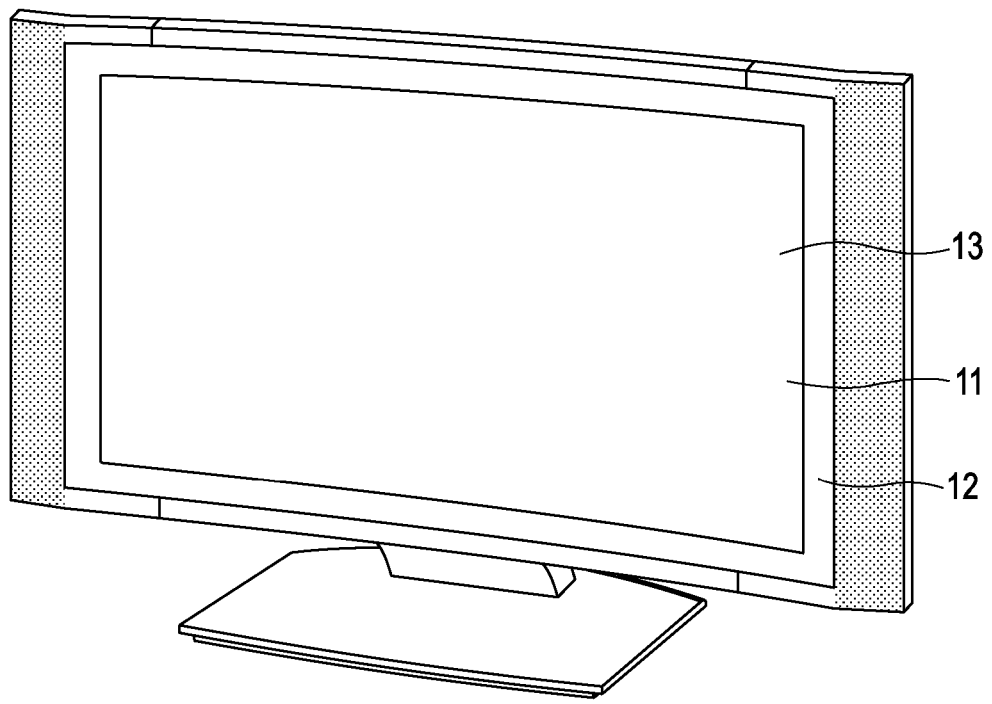
FIG. 19 is a perspective view illustrating a television set including the display apparatus according to any of the embodiments of the present invention.

FIG. 19 shows a television set to which the present invention is applied. The television set includes a front panel 12 and a video image display screen 11 constituted by a filter glass 13. The display apparatus according to the present invention is employed as the video image display screen 11.

Figure 20A:
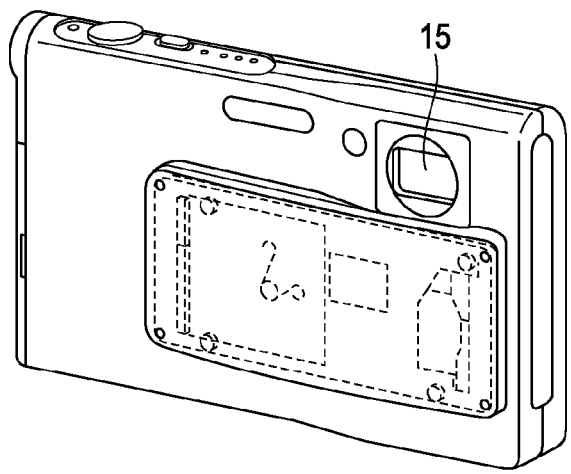
FIGS. 20A and 20B are perspective views illustrating a digital still camera including the display apparatus according to any of the embodiments of the present invention.
Figure 20B:
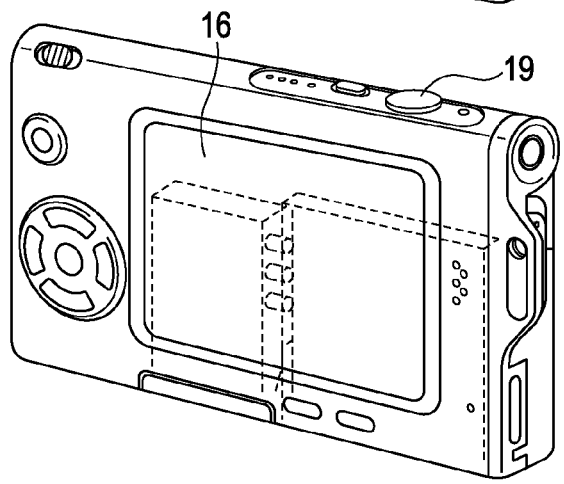

FIGS. 20A and 20B show a digital still camera to which the present invention is applied, FIG. 20A being a front view and FIG. 20B being a back view. This digital still camera includes an image-pickup lens, a light-emission portion 15 for flash photography, a display 16, a control switch, a menu switch, and a shutter 19. The display apparatus according to the present invention is employed as the display 16.

Figure 21:
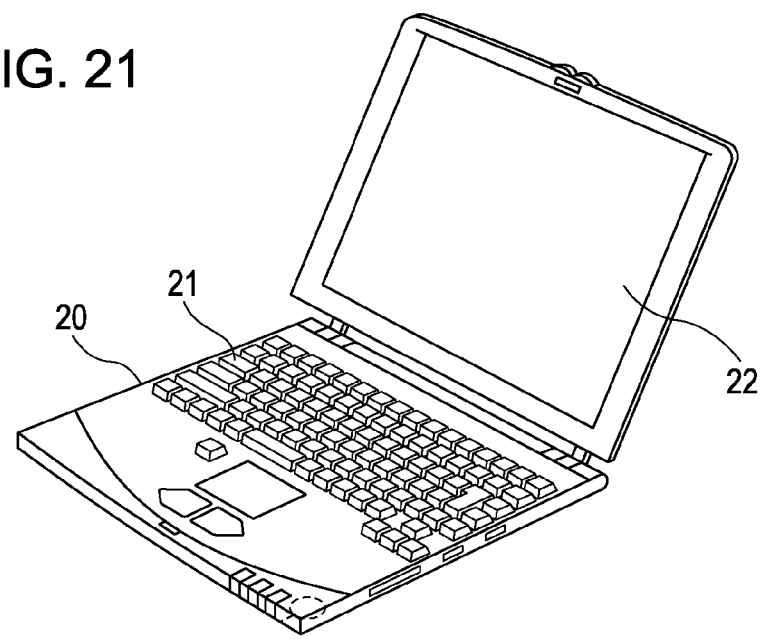
FIG. 21 is a perspective view illustrating a laptop personal computer including the display apparatus according to any of the embodiments of the present invention.

FIG. 21 shows a laptop personal computer to which the present invention is applied. The laptop personal computer includes a body 20 having a keyboard 21 used for inputting characters and a body cover having a display 22 for displaying images. The display apparatus according to the present invention is employed as the display 22.

Figure 22A:
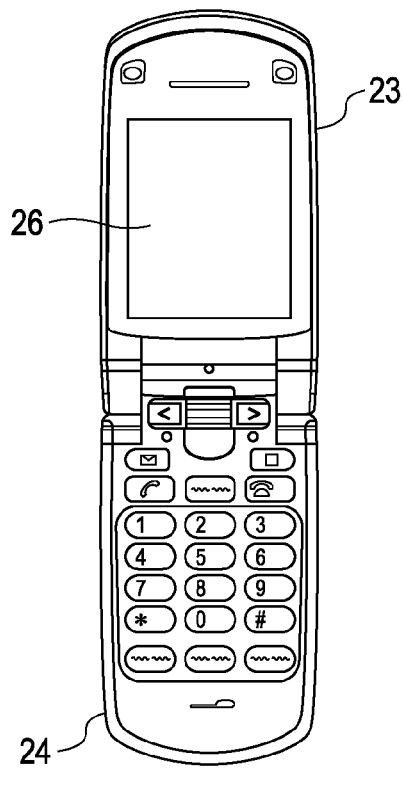
FIGS. 22A and 22B are schematic views illustrating a mobile terminal apparatus including the display apparatus according to any of the embodiments of the present invention.
Figure 22B:
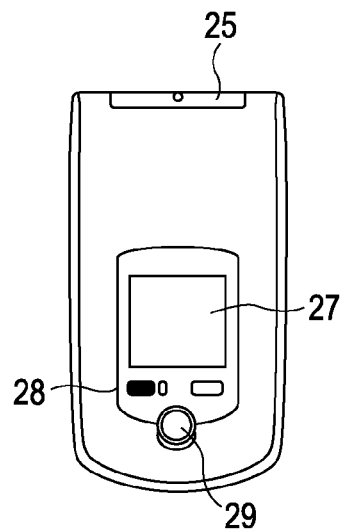
Figure 23:
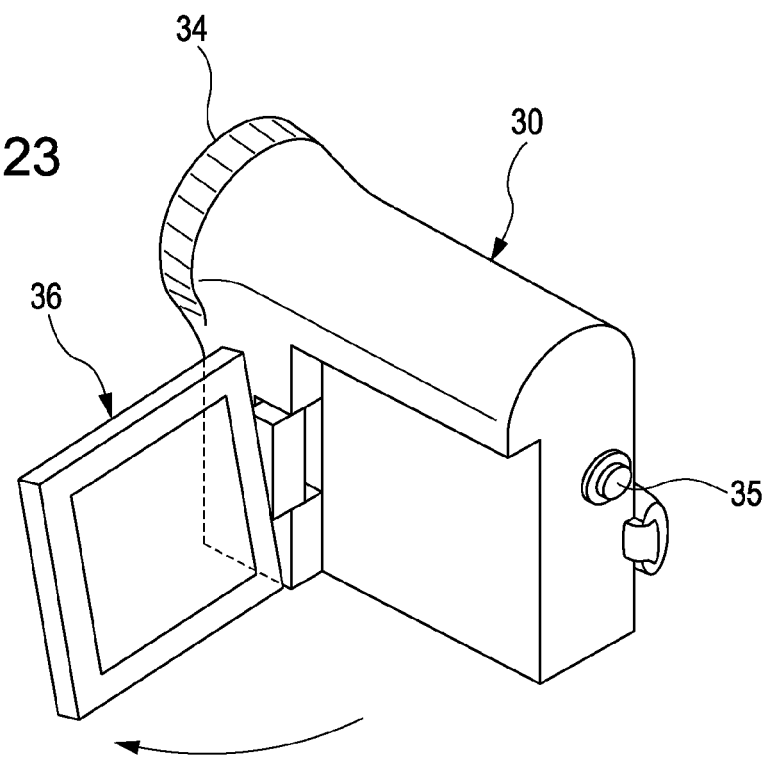
FIG. 23 is a perspective view illustrating a video camera including the display apparatus according to any of the embodiments of the present invention.

FIGS. 22A and 22B show a mobile terminal to which the present invention is applied, FIG. 22A showing the mobile terminal in an open state and FIG. 22B showing the mobile terminal in a closed state. The mobile terminal includes an upper body 23, a lower body 24, a connection portion (a hinge portion herein) 25, a display 26, a sub-display 27, a picture light 28, and a camera unit 29. The display apparatus according to the present invention is employed as the display 26 and the sub-display 27.

FIG. 24 shows a video camera to which the present invention is applied. The video camera includes a body 30, a lens 34 which is disposed on a front side of the body 30 and which is used for capturing an image of a subject, a start/stop switch 35 used for shooting, and a monitor 36. The display apparatus according to the present invention is employed as the monitor 36.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix display apparatus including scanning lines as rows for supplying control signals, signal lines as columns for supplying video signals, pixels arranged in matrix so as to correspond to intersections of the scanning lines and the signal lines, and a substrate on which the scanning lines, the signal lines, and the pixels are arranged, each of the pixels comprising:
   a sampling transistor used to take in one of the video signals in response to one of the control signals;
   a drive transistor used to generate a driving current in accordance with the taken video signal; and
   a light-emitting device which emits light with luminance in accordance with the video signal when the driving current is supplied,
   wherein the light-emitting device includes a pair of electrodes, that is, an anode and a cathode, and a light-emitting layer arranged between the pair of electrodes, and therefore is a two-terminal thin-film device, at least one of the pair of electrodes is divided into a plurality of pieces whereby the light-emitting device is divided into a plurality of sub-light-emitting devices, the plurality of sub-light-emitting devices receive the driving current from the drive transistor and emit light with luminance as a whole in accordance with the video signal, and when one of the sub-light-emitting devices includes a short-circuit defect, the sub-light-emitting device including the short-circuit defect is separated from the corresponding one of the pixels and the driving current is supplied to the remaining sub-light-emitting devices, and the luminance in accordance with the video signal is maintained using the remaining sub-light-emitting devices.

2. The active matrix display apparatus according to claim 1,
   wherein each of the plurality of electrodes obtained by dividing one of the pair of electrodes is connected to a corresponding path of a current supplied from the single drive transistor through a corresponding line, and when the line is broken by a laser beam emitted from the outside of the substrate, the sub-light-emitting device including the short-circuit defect is separated from the current path.

3. An electronic apparatus including the display apparatus set forth in claim 1.

* * * * *